(12) United States Patent
Lee et al.

(10) Patent No.: US 12,495,645 B2
(45) Date of Patent: Dec. 9, 2025

(54) DISPLAY APPARATUS HAVING A LIGHT-EMITTING DEVICE

(71) Applicant: LG Display Co., Ltd., Seoul (KR)

(72) Inventors: Si Kyu Lee, Paju-si (KR); Jae Wook Kwon, Paju-si (KR); Ung Gi Lee, Paju-si (KR); Gun Woo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 448 days.

(21) Appl. No.: 18/074,692

(22) Filed: Dec. 5, 2022

(65) Prior Publication Data

US 2023/0197899 A1    Jun. 22, 2023

(30) Foreign Application Priority Data

Dec. 16, 2021 (KR) .......................... 10-2021-0180747

(51) Int. Cl.
*H10H 20/831* (2025.01)
*H10H 20/832* (2025.01)
(Continued)

(52) U.S. Cl.
CPC ........ *H10H 20/831* (2025.01); *H10H 20/832* (2025.01); *H10H 20/84* (2025.01); *H10H 20/853* (2025.01); *H10H 20/857* (2025.01)

(58) Field of Classification Search
CPC .... H10H 20/831; H10H 20/832; H10H 20/84; H10H 20/853; H10H 20/857;
(Continued)

(56) References Cited

U.S. PATENT DOCUMENTS 10,573,694 B2 * 2/2020 Choi ...................... H10K 59/88
2019/0189721 A1 * 6/2019 Kim ..................... G02F 1/136227
(Continued)

FOREIGN PATENT DOCUMENTS

EP    3240036 A1    11/2017
EP    3840052 A1    6/2021
(Continued)

OTHER PUBLICATIONS

Extended European Search Report of Application No. 22210650.2, dated May 9, 2023, 10 pages.

*Primary Examiner* — Earl N Taylor
(74) *Attorney, Agent, or Firm* — Morgan, Lewis & Bockius LLP

(57) ABSTRACT

A display apparatus may include a display panel that may include a display area in which a light-emitting device is disposed, and a bezel area disposed outside the display area. A device substrate may extend throughout the display area and the bezel area. An over-coat layer may be on the display area and the bezel area of the device substrate. The light-emitting device may include a first electrode, a light-emitting layer and a second electrode. A bank insulating layer covering an edge of the first electrode may extend on the over-coat layer of the bezel area. An opening penetrating the over-coat layer and the bank insulating layer may be on the bezel area of the device substrate. A sidewall of the opening may be covered by the second electrode. Thus, the penetration of external moisture through the over-coat layer and the bank insulating layer may be blocked or delayed.

21 Claims, 19 Drawing Sheets

(51) Int. Cl.
    *H10H 20/84*     (2025.01)
    *H10H 20/853*     (2025.01)
    *H10H 20/857*     (2025.01)

(58) Field of Classification Search
    CPC ............ H10K 59/8722; H10K 59/122; H10K 59/8052; H10K 59/873; H10K 59/124; H10K 50/846; H10K 50/841; H10K 50/844; H10K 59/131; H01L 33/38; H01L 33/40; H01L 33/44; H01L 33/54; H01L 33/62
    See application file for complete search history.

(56) References Cited

U.S. PATENT DOCUMENTS

| | | | | |
|---|---|---|---|---|
| 2019/0198799 | A1* | 6/2019 | Lee | H10K 50/84 |
| 2020/0058894 | A1* | 2/2020 | Kim | H10K 50/87 |
| 2020/0064968 | A1* | 2/2020 | Kim | H10K 59/8792 |
| 2020/0091260 | A1* | 3/2020 | Lee | H10K 59/38 |
| 2020/0343481 | A1* | 10/2020 | Lee | G06F 1/1626 |
| 2021/0074955 | A1* | 3/2021 | Baek | H10K 50/844 |
| 2021/0193954 | A1* | 6/2021 | Shin | H10K 59/122 |
| 2021/0273026 | A1* | 9/2021 | Seo | H10K 59/124 |
| 2021/0408444 | A1* | 12/2021 | Ouyang | H10K 59/1201 |
| 2023/0056480 | A1* | 2/2023 | Yang | H10K 59/8722 |
| 2023/0165070 | A1* | 5/2023 | Na | H10K 50/844 257/72 |
| 2023/0197899 | A1* | 6/2023 | Lee | H10K 59/873 257/79 |
| 2023/0217752 | A1* | 7/2023 | Pang | H10K 50/844 257/91 |
| 2025/0029564 | A1* | 1/2025 | Kang | H10D 86/60 |

FOREIGN PATENT DOCUMENTS

| | | |
|---|---|---|
| EP | 3846218 A1 | 7/2021 |
| KR | 10-0722103 B1 | 5/2007 |
| KR | 10-2018-0036432 A | 4/2018 |
| KR | 10-2019-0024117 A | 3/2019 |
| KR | 10-2020-0032496 A | 3/2020 |
| KR | 10-2021-0031099 A | 3/2021 |
| WO | 2020-206721 A1 | 10/2020 |

\* cited by examiner

DISPLAY APPARATUS HAVING A LIGHT-EMITTING DEVICE

CROSS-REFERENCE TO RELATED APPLICATION

This application claims the benefit of and priority to Korean Patent Application No. 10-2021-0180747, filed on Dec. 16, 2021, the entirety of which is incorporated herein by reference for all purposes as if fully set forth herein.

BACKGROUND

1. Technical Field

The present disclosure relates to apparatus and methods and particularly to, for example, without limitation, a display apparatus in which a light-emitting device is disposed on a device substrate.

2. Discussion of the Related Art

Generally, a display apparatus provides an image to a user. For example, the display apparatus may include a plurality of light-emitting devices. The light-emitting devices may emit light displaying a specific color. For example, each of the light-emitting devices may include a first electrode, a light-emitting layer and a second electrode, which are sequentially stacked.

A device substrate supporting the light-emitting devices may include a display area and a bezel area disposed outside the display area. Signal wirings and insulating layers may be disposed on the bezel area of the device substrate. Various signals for controlling the operation of each light-emitting device may be applied through the signal wirings. The signal wirings may be insulated from each other by the insulating layers. For example, an over-coat layer disposed between the device substrate and the light-emitting devices and a bank insulating layer covering an edge of the first electrode may extend on the bezel area of the device substrate.

The over-coat layer and the bank insulating layer may include an organic insulating material. The light-emitting layer may be vulnerable to moisture. Thus, in the display apparatus, the light-emitting layer may be deteriorated by external moisture penetrating through the over-coat layer and the bank insulating layer. Therefore, in the display apparatus, the quality of the image being provided to the user may be degraded.

The description provided in the discussion of the related art section should not be assumed to be prior art merely because it is mentioned in or associated with that section. The discussion of the related art section may include information that describes one or more aspects of the subject technology.

SUMMARY

The inventors of the present disclosure have recognized the problems and disadvantages of the related art and have performed extensive research and experiments. The inventors of the present disclosure have thus invented a new display apparatus that substantially obviate one or more problems due to limitations and disadvantages of the related art.

An object of the present disclosure is to provide a display apparatus capable of minimizing the degradation of the image quality due to the external moisture.

Another object of the present disclosure is to provide a display apparatus capable of blocking or delaying the penetration of the external moisture.

Additional features, objects, advantages, and aspects of the present disclosure are set forth in part in the description that follows and in part will become apparent from the present disclosure or may be learned by practice of the inventive concepts provided herein. Other features, objects, advantages, and aspects of the present disclosure may be realized and attained by the descriptions provided in the present disclosure, or derivable therefrom, and the claims hereof as well as the appended drawings. It is intended that all such features, objects, advantages, and aspects be included within this description, be within the scope of the present disclosure, and be protected by the following claims. Nothing in this section should be taken as a limitation on those claims. Further aspects and advantages are discussed below in conjunction with embodiments of the disclosure.

To achieve these objects and other advantages and in accordance with the purposes of the present disclosure, as embodied and broadly described herein, in one or more aspects, there is provided a display apparatus comprising a display area and a bezel area. The bezel area is disposed outside the display area. A device substrate is provided in the display area and the bezel area. A light-emitting device is disposed on the display area of the device substrate. The light-emitting device includes a first electrode, a light-emitting layer and a second electrode, which are sequentially stacked. An over-coat layer is disposed between the device substrate and the light-emitting device. The over-coat layer extends on the bezel area of the device substrate. A bank insulating layer covering an edge of the first electrode extends on the over-coat layer of the bezel area. A moisture blocking hole is disposed on the bezel area of the device substrate. The moisture blocking hole penetrates the over-coat layer and the bank insulating layer. The second electrode of the light-emitting device extends on a sidewall of the moisture blocking hole.

The second electrode of the light-emitting device may include a metal.

A second light-emitting device may be disposed on the display area of the device substrate, the second light-emitting device including a first electrode, a light-emitting layer and a second electrode, which are sequentially stacked. The second electrode of the light-emitting device and the second electrode of the second light-emitting device may be configured to receive a same voltage.

The second electrode of the light-emitting device may be connected to a node or a line for coupling to a power voltage supply.

The first electrode, rather than the second electrode, may be closer to the over-coat layer. The second electrode of the light-emitting device may extend on a bottom surface of the moisture blocking hole.

A pixel driving circuit may be disposed in the display area between the device substrate and the over-coat layer. The pixel driving circuit may be electrically connected to the first electrode of the light-emitting device and signal wirings. The signal wirings may extend on the bezel area of the device substrate. The moisture blocking hole may be disposed between the signal wirings.

The display apparatus may further comprise signal wirings and a pixel driving circuit electrically connected to the signal wirings. The signal wirings may extend on the bezel area of the device substrate. The moisture blocking hole may be disposed between the signal wirings.

The moisture blocking hole may extend in the same direction as the signal wirings.

A moisture blocking pattern may be disposed between the sidewall of the moisture blocking hole and the second electrode of the light-emitting device. An end of the moisture blocking pattern may be disposed between the over-coat layer and the bank insulating layer in the bezel area.

The moisture blocking pattern may include the same material as the first electrode of the light-emitting device. The moisture blocking pattern may be formed simultaneously with the first electrode of the light-emitting device.

An encapsulating element covering the light-emitting device may extend on the bezel area of the device substrate. The moisture blocking hole may be filled with the encapsulating element.

The encapsulating element may include moisture absorbing particles.

In another embodiment, there is provided a display apparatus comprising a device substrate. An over-coat layer is disposed on a display area and a bezel area of the device substrate. A light-emitting device is disposed on the over-coat layer of the display area. The light-emitting device includes a first electrode, a light-emitting layer and a second electrode, which are sequentially stacked. A bank insulating layer covering an edge of the first electrode extends on the over-coat layer of the bezel area. A moisture blocking trench penetrating the over-coat layer and the bank insulating layer in the bezel area extends along an edge of the display area. An inner sidewall of the moisture blocking trench toward the display area is covered by the second electrode of the light-emitting device.

The second electrode of the light-emitting device may extend on an outer sidewall of the moisture blocking trench opposite to the display area.

The moisture blocking trench may include a lower trench penetrating the over-coat layer and an upper trench penetrating the bank insulating layer. The upper trench may be disposed in the lower trench. A sidewall of the lower trench may be covered by the bank insulating layer.

The bank insulating layer may have a water vapor transmission rate lower than the over-coat layer.

A pixel driving circuit may be disposed in the display area between the device substrate and the over-coat layer. The pixel driving circuit may be electrically connected to the light-emitting device and the signal wirings. The signal wiring may extend on the bezel area of the device substrate. The moisture blocking trench may be disposed outside the signal wirings.

The display apparatus may further comprise signal wirings and a pixel driving circuit electrically connected to the signal wirings. The signal wirings may extend on the bezel area of the device substrate. The moisture blocking trench may be disposed outside the signal wirings.

A moisture blocking hole may be disposed between the signal wirings. A sidewall of the moisture blocking hole may be covered by the second electrode of the light-emitting device.

A device passivation layer may be disposed between the device substrate and the over-coat layer. The device passivation layer may include a material different from the over-coat layer and the bank insulating layer. The moisture blocking trench may penetrate the device passivation layer.

The inner sidewall of the moisture blocking trench may have a stepped shape.

The inner sidewall of the moisture blocking trench may have a concave-convex shape, in plan-view.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure. In the drawings.

Figure 1:
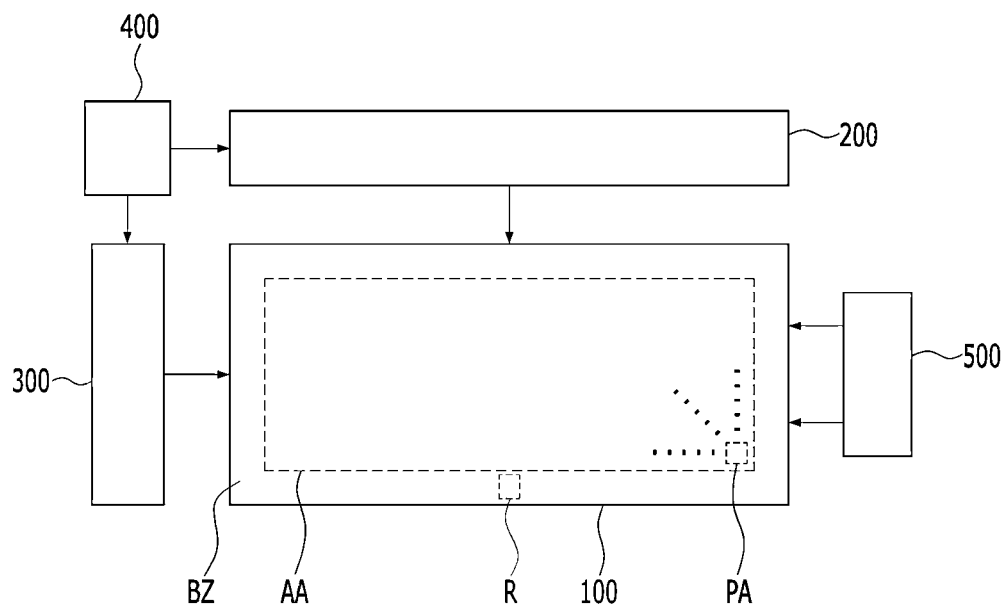
FIG. 1 is a view schematically showing a display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the terms "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

Hereinafter, various example embodiments of the present disclosure are described in detail with reference to the accompanying drawings. For convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

Figure 2:
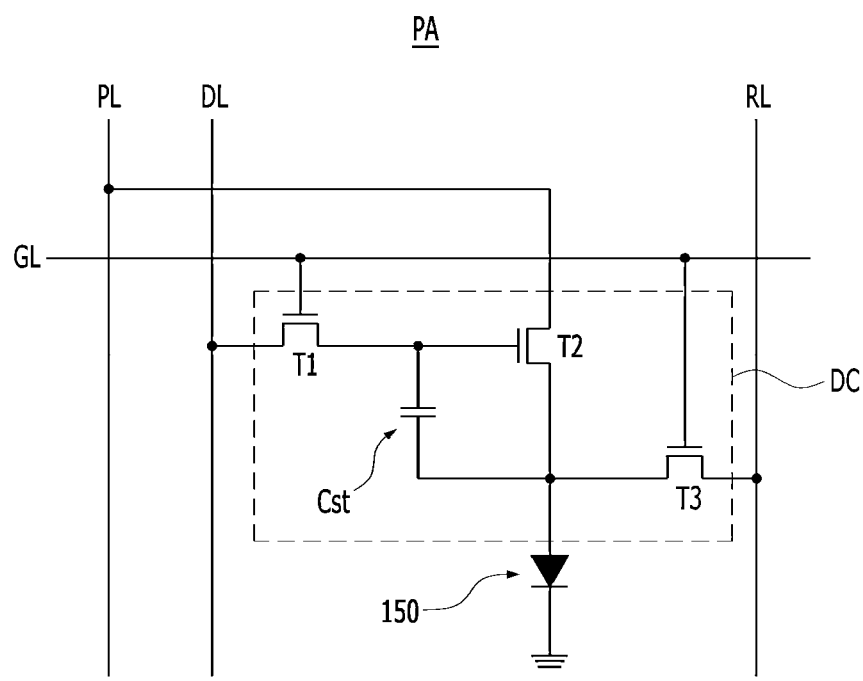
FIG. 2 is a view showing a configuration of a pixel area in the display apparatus according to the example embodiment of the present disclosure.
Figure 3:
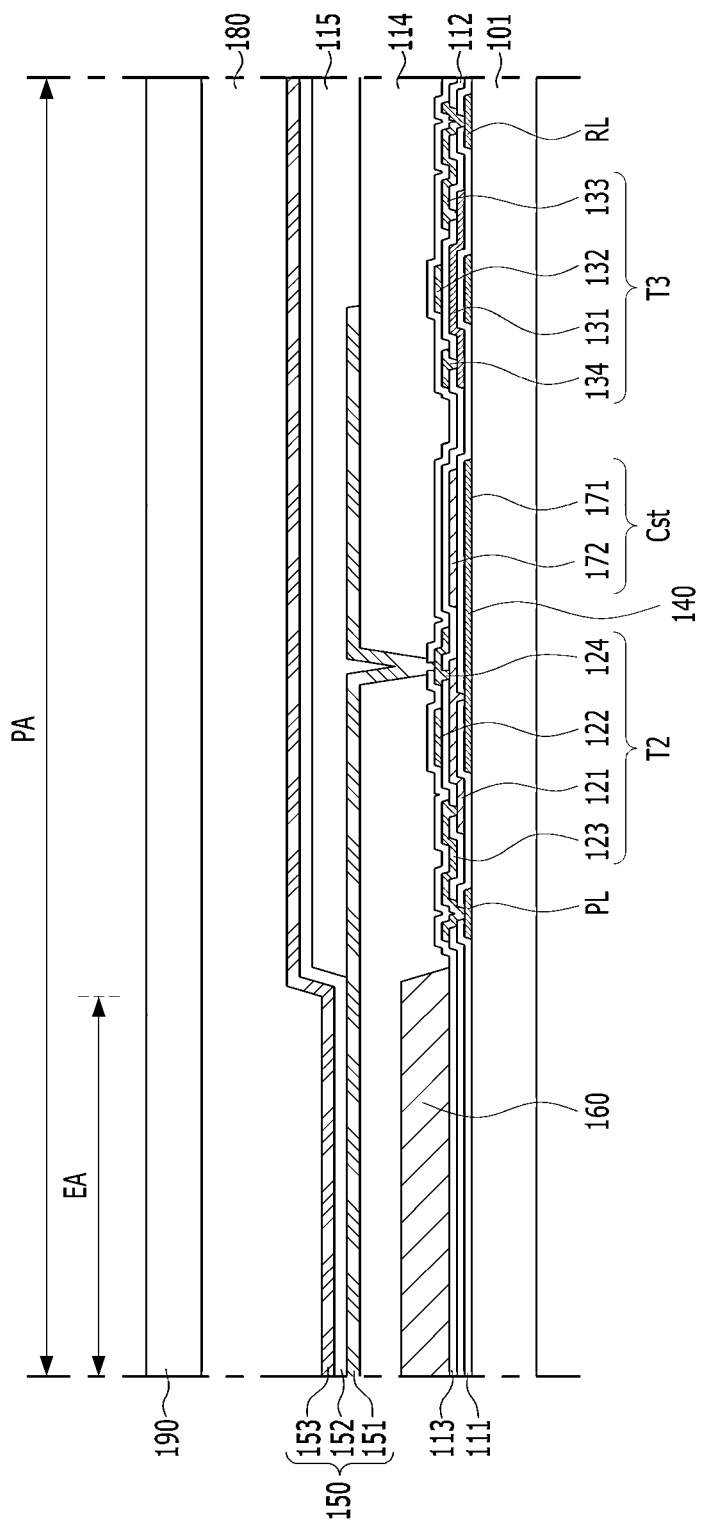
FIG. 3 is a view partially showing a cross-section of the pixel area in the display apparatus according to the example embodiment of the present disclosure.

FIG. 1 is a view schematically showing a display apparatus according to an example embodiment of the present disclosure. FIG. 2 is a view showing a configuration of a pixel area in the display apparatus according to the example embodiment of the present disclosure. FIG. 3 is a view partially showing a cross-section of the pixel area in the display apparatus according to the example embodiment of the present disclosure.

Referring to FIGS. 1 to 3, the display apparatus according to the example embodiment of the present disclosure may include a display panel 100, a data driver 200, a gate driver 300, a timing controller 400 and a power unit 500.

The display panel 100 may generate an image being provided to a user. For example, the display panel 100 may include a plurality of pixel areas PA. The data driver 200, the gate driver 300, the timing controller 400 and the power unit 500 may control the operation of each pixel area PA. For example, the data driver 200 may apply a data signal to each pixel area PA through data lines DL (e.g., a data line DL or one or more data lines DL), and the gate driver 300 may apply a gate signal to each pixel area PA through gate lines GL (e.g., a gate line GL or one or more gate lines GL). The power unit 500 may supply a power voltage to each pixel area PA through one or more power voltage supply lines PL, and supply a reference voltage to each pixel area PA through one or more reference voltage supply lines RL. The timing controller 400 may control the data driver 200 and the gate driver 300. For example, the data driver 200 may receive digital video data and a source timing control signal from the timing controller 400, and the gate driver 300 may receive clock signals, reset clock signals and start signals from the timing controller 400.

Each of the pixel areas PA may realize a specific color. For example, a light-emitting device 150 supported by a device substrate 101 may be disposed in each pixel area PA. The display panel 100 may include the device substrate 101, which may include an insulating material. The device substrate 101 may include a transparent material. For example, the device substrate 101 may include glass or plastic. The light-emitting device 150 may emit light displaying a specific color. For example, the light-emitting device 150 may include a first electrode 151, a light-emitting layer 152 and a second electrode 153, which are sequentially stacked on the device substrate 101.

The first electrode 151 may include a conductive material. The first electrode 151 may have a high transmittance. For example, the first electrode 151 may be a transparent electrode made of a transparent conductive material, such as indium tin oxide (ITO) and indium zinc oxide (IZO).

The light-emitting layer 152 may generate light having luminance corresponding to a voltage difference between the first electrode 151 and the second electrode 153. For example, the light-emitting layer 152 may include an emission material layer (EML) having an emission material. The emission material may include an organic material, an inorganic material or a hybrid material. For example, the display apparatus according to the example embodiment of the present disclosure may be an organic light-emitting display apparatus including an organic emission material.

The light-emitting layer 152 may have a multi-layer structure. For example, the light-emitting layer 152 may further include at least one of a hole injection layer (HIL), a hole transport layer (HTL), an electron transport layer (ETL) and an electron injection layer (EIL). Thus, in the display apparatus according to the example embodiment of the present disclosure, the emission efficiency of the light-emitting layer 152 may be improved.

The second electrode 153 may include a conductive material. The second electrode 153 may include a material different from the first electrode 151. For example, the transmittance of the second electrode 153 may be lower than the transmittance of the first electrode 151. The second electrode 153 may have a reflectance higher than the first electrode 151. For example, the second electrode 153 may include a metal, such as aluminum (Al), silver (Ag), an alloy of any of the foregoing, or some combination thereof. Thus, in the display panel 100 of the display apparatus according to the example embodiment of the present disclosure, the light generated by the light-emitting layer 152 may be emitted to the outside through the first electrode 151 and the device substrate 101.

Each of the pixel areas PA may include a pixel driving circuit DC to control the operation of the light-emitting device 150. For example, the pixel driving circuit DC of each pixel area PA may generate a driving current corresponding to the data signal according to the gate signal. The driving current generated by the pixel driving circuit DC of each pixel area PA may be provided to the light-emitting device 150 of the corresponding pixel area PA for one frame. For example, the pixel driving circuit DC of each pixel area PA may include a first thin film transistor T1, a second thin film transistor T2, a third thin film transistor T3 and a storage capacitor Cst.

The first thin film transistor T1 may include a first semiconductor pattern, a first gate electrode, a first source electrode and a first drain electrode. The second thin film transistor T2 may have the same structure as the first thin film transistor T1. For example, the second thin film transistor T2 may include a second semiconductor pattern 121, a second gate electrode 122, a second source electrode 123 and a second drain electrode 124.

The first semiconductor pattern and the second semiconductor pattern 121 may include a semiconductor material. For example, each of the first semiconductor pattern and the second semiconductor pattern 121 may include an oxide semiconductor, such as indium gallium zinc oxide (IGZO). The second semiconductor pattern 121 may include the same material as the first semiconductor pattern. The second semiconductor pattern 121 may be disposed on the same layer as the first semiconductor pattern. For example, the second semiconductor pattern 121 may be formed simultaneously with the first semiconductor pattern.

Each of the first semiconductor pattern and the second semiconductor pattern 121 may include a source region, a channel region and a drain region. The channel region may be disposed between the source region and the drain region. The source region and the drain region may have a resistance lower than the channel region. For example, the source region and the drain region may include a conductorized region of an oxide semiconductor. The channel region may be a region of an oxide semiconductor, which is not conductorized.

Each of the first gate electrode and the second gate electrode 122 may include a conductive material. For example, each of the first gate electrode and the second gate electrode 122 may include a metal, such as aluminum (Al), chrome (Cr), copper (Cu), molybdenum (Mo), titanium (Ti), tungsten (W), an alloy of any of the foregoing, or some combination thereof. The second gate electrode 122 may include the same material as the first gate electrode. The second gate electrode 122 may be disposed on the same layer as the first gate electrode. For example, the second gate electrode 122 may be formed simultaneously with the first gate electrode.

The first gate electrode may be disposed on the first semiconductor pattern. For example, the first gate electrode may overlap the channel region of the first semiconductor pattern. The second gate electrode 122 may be disposed on the second semiconductor pattern 121. For example, the second gate electrode 122 may overlap the channel region of the second semiconductor pattern 121. The first gate electrode may be insulated from the first semiconductor pattern, and the second gate electrode 122 may be insulated from the second semiconductor pattern 121. For example, the channel region of the first semiconductor pattern may have an electric conductivity corresponding to a voltage applied to the first gate electrode, and the channel region of the second semiconductor pattern 121 may have an electric conductivity corresponding to a voltage applied to the second gate electrode 122.

The first source electrode, the first drain electrode, the second source electrode 123 and the second drain electrode 124 may include a conductive material. For example, each of the first source electrode, the first drain electrode, the second source electrode 123 and the second drain electrode 124 may include a metal, such as aluminum (Al), chrome (Cr), copper (Cu), molybdenum (Mo), titanium (Ti), tungsten (W), an alloy of any of the foregoing, or some combination thereof. The first drain electrode may include the same material as the first source electrode. For example, the first drain electrode may be disposed on the same layer as the first source electrode. The second drain electrode 124 may include the same material as the second source electrode 123. For example, the second drain electrode 124 may be disposed on the same layer as the second source electrode 123. The second drain electrode 124 may include the same material as the first drain electrode. For example, the second source electrode 123 and the second drain electrode 124 may be formed simultaneously with the first source electrode and the first drain electrode.

The first source electrode may be electrically connected to the source region of the first semiconductor pattern. The first drain electrode may be electrically connected to the drain region of the first semiconductor pattern. For example, the first drain electrode may be spaced away from the first source electrode. The second source electrode 123 may be electrically connected to the source region of the second semiconductor pattern 121. The second drain electrode 124 may be electrically connected to the drain region of the second semiconductor pattern 121. For example, the second drain electrode 124 may be spaced away from the second source electrode 123.

The third thin film transistor T3 may have the same structure as the second thin film transistor T2. For example, the third thin film transistor T3 may include a third semiconductor pattern 131, a third gate electrode 132, a third source electrode 133 and a third drain electrode 134.

The third semiconductor pattern 131 may include a semiconductor material. For example, the third semiconductor pattern 131 may include an oxide semiconductor, such as IGZO. The third semiconductor pattern 131 may include the same material as the second semiconductor pattern 121. The third semiconductor pattern 131 may be disposed on the same layer as the second semiconductor pattern 121. For example, the third semiconductor pattern 131 may be formed simultaneously with the second semiconductor pattern 121. The third semiconductor pattern 131 may have the same structure as the second semiconductor pattern 121. For example, the third semiconductor pattern 131 may include a channel region between a source region and a drain region.

The third gate electrode 132 may include a conductive material. For example, the third gate electrode 132 may include a metal, such as aluminum (Al), chrome (Cr), copper (Cu), molybdenum (Mo), titanium (Ti), tungsten (W), an alloy of any of the foregoing, or some combination thereof. The third gate electrode 132 may include the same material as the second gate electrode 122. The third gate electrode 132 may be disposed on the same layer as the second gate electrode 122. For example, the third gate electrode 132 may be formed simultaneously with the second gate electrode 122.

The third gate electrode 132 may be disposed on the third semiconductor pattern 131. For example, the third gate electrode 132 may overlap the channel region of the third semiconductor pattern 131. The third gate electrode 132 may be insulated from the third semiconductor pattern 131. For example, the channel region of the third semiconductor pattern 131 may have an electrical conductivity corresponding to a voltage applied to the third gate electrode 132.

The third source electrode 133 and the third drain electrode 134 may include a conductive material. For example, each of the third source electrode 133 and the third drain electrode 134 may include a metal, such as aluminum (Al), chrome (Cr), copper (Cu), molybdenum (Mo), titanium (Ti), tungsten (W), an alloy of any of the foregoing, or some combination thereof. The third drain electrode 134 may include the same material as the third source electrode 133. For example, the third drain electrode 134 may be formed simultaneously with the third source electrode 133. The third drain electrode 134 may include the same material as the second drain electrode 124. For example, the third source electrode 133 and the third drain electrode 134 may be formed simultaneously with the second source electrode 123 and the second drain electrode 124.

The third source electrode 133 may be electrically connected to the source region of the third semiconductor pattern 131. The third drain electrode 134 may be electrically connected to the drain region of the third semiconductor pattern 131. For example, the third drain electrode 134 may be spaced away from the third source electrode 133.

The thin film transistors T1, T2 and T3 of each pixel area PA may be disposed between the device substrate 101 and the light-emitting device 150 of the corresponding pixel area PA. For example, at least one of insulating layers 111, 112, 113, 114 and 115 may be disposed on the device substrate 101 to prevent unnecessary connection between the thin film transistors T1, T2 and T3 and the light-emitting device 150 of each pixel area PA. For example, a device buffer layer 111, a gate insulating layer 112, a device passivation layer 113, an over-coat layer 114 and a bank insulating layer 115 may be disposed on the device substrate 101.

The device buffer layer 111 may include an insulating material. For example, the device buffer layer 111 may include an inorganic insulating material, such as silicon oxide (SiO) and silicon nitride (SiN). The device buffer layer 111 may include a multi-layer structure. For example, the device buffer layer 111 may have a stacked structure of a layer made of silicon nitride (SiN) and a layer made of silicon oxide (SiO).

The device buffer layer 111 may be disposed between the device substrate 101 and the thin film transistors T1, T2 and T3 of each pixel area PA. The device buffer layer 111 may prevent pollution due to the device substrate 101 in a process of forming the thin film transistors T1, T2 and T3. For example, an entire surface of the device substrate 101 toward the thin film transistors T1, T2 and T3 of each pixel area PA may be covered by the device substrate 101.

The gate insulating layer 112 may include an insulating material. For example, the gate insulating layer 112 may include an inorganic insulating material, such as silicon oxide (SiO) and silicon nitride (SiN). The gate insulating layer 112 may include a material having a high dielectric constant (K). For example, the gate insulating layer 112 may include a high-K material, such as hafnium oxide (HfO). The gate insulating layer 112 may have a multi-layer structure.

The gate insulating layer 112 may be disposed on the device buffer layer 111. The gate insulating layer 112 may extend between the semiconductor pattern 121 and 131 and the gate electrode 122 and 132 of each thin film transistor T1, T2 and T3. For example, the gate insulating layer 112 may cover the first semiconductor pattern, the second semiconductor pattern 121 and the third semiconductor pattern 131 of each pixel area PA. The first gate electrode, the second gate electrode 122 and the third gate electrode 132 of each pixel area PA may be disposed on the gate insulating layer 112. For example, the gate electrode 122 and 132 of each thin film transistor T1, T2 and T3 may be insulated from the semiconductor pattern 121 and 131 of the corresponding thin film transistor T1, T2 and T3 by the gate insulating layer 112.

The source electrode 123 and 133 and the drain electrode 124 and 134 of each thin film transistor T1, T2 and T3 may be disposed on the gate insulating layer 112. For example, the gate insulating layer 112 may include source contact holes partially exposing the source region of each semiconductor pattern 121 and 131, and drain contact holes partially exposing the drain region of each semiconductor pattern 121 and 131. The source electrode 123 and 133 of each thin film transistor T1, T2 and T3 may be connected to the source region of the corresponding semiconductor pattern 121 and 131 by one of the source contact holes, and the drain electrode 124 and 134 of each thin film transistor T1, T2 and T3 may be connected to the drain region of the corresponding semiconductor pattern 121 and 131 by one of the drain contact holes.

The device passivation layer 113 may include an insulating material. For example, the device passivation layer 113 may include an inorganic insulating material, such as silicon oxide (SiO) and silicon nitride (SiN).

The device passivation layer 113 may be disposed on the gate insulating layer 112. The device passivation layer 113 may prevent the damage of each thin film transistor T1, T2 and T3 due to external impact and moisture. For example, the gate electrode 122 and 132, the source electrode 123 and 133, and the drain electrode 124 and 134 of each thin film transistor T1, T2 and T3 may be covered by the device passivation layer 113. The device passivation layer 113 may extend along a surface of each thin film transistor T1, T2 and T3 opposite to the device substrate 101. For example, the device passivation layer 113 covering the thin film transistors T1, T2 and T3 of each pixel area PA may be in direct contact with the device passivation layer 113 covering the thin film transistors T1, T2 and T3 of adjacent pixel area PA.

The device passivation layer 113 may be in direct contact with the gate insulating layer 112 at the outside of each thin film transistor T1, T2 and T3. For example, the source electrode 123 and 133 and the drain electrode 124 and 134 of each thin film transistor T1, T2 and T3 may be disposed on the same layer as the gate electrode 122 and 132 of the corresponding thin film transistor T1, T2 and T3. The source electrode 123 and 133 and the drain electrode 124 and 134 of each thin film transistor T1, T2 and T3 may be formed simultaneously with the gate electrode 122 and 132 of the corresponding thin film transistor T1, T2 and T3. The source electrode 123 and 133 and the drain electrode 124 and 134 of each thin film transistor T1, T2 and T3 may include the same materials as the gate electrode 122 and 132 of the corresponding thin film transistor T1, T2 and T3. Thus, in the display apparatus according to the example embodiment of the present disclosure, a process of forming the thin film transistors T1, T2 and T3 in each pixel area PA may be simplified.

The over-coat layer 114 may include an insulating material. The over-coat layer 114 may include a material different from the device passivation layer 113. For example, the over-coat layer 114 may include an organic insulating material.

The over-coat layer 114 may be disposed on the device passivation layer 113. The over-coat layer 114 may remove a thickness difference due to the thin film transistors T1, T2 and T3 of each pixel area PA. For example, an upper surface of the over-coat layer 114 opposite to the device substrate 101 may be a flat surface. The first electrode 151, the light-emitting layer 152 and the second electrode 153 of the light-emitting device 150 may be sequentially stacked on the upper surface of the over-coat layer 114. Thus, in the display apparatus according to the example embodiment of the present disclosure, a phase deviation and a luminance deviation according to a generated location of the light emitted to the outside through the device substrate 101 may be prevented.

A bank insulating layer 115 may include an insulating material. For example, the bank insulating layer 115 may include an organic insulating material. The bank insulating layer 115 may include a material different from the over-coat layer 114.

The bank insulating layer 115 may be disposed on the over-coat layer 114. The first electrode 151 of each light-emitting device 150 may be insulated from the first electrode 151 of adjacent light-emitting device 150 by the bank insulating layer 115. For example, the bank insulating layer 115 may cover an edge of the first electrode 151 in each pixel area PA. Thus, in the display apparatus according to the example embodiment of the present disclosure, the light-emitting device 150 of each pixel area PA may be independently controlled by the bank insulating layer 115. The light-emitting layer 152 and the second electrode 153 of each light-emitting device 150 may be stacked on a portion of the corresponding first electrode 151 exposed by the bank insulating layer 115. For example, the bank insulating layer 115 may define an emission area EA in each pixel area PA.

The emission area EA of each pixel area PA defined by the bank insulating layer 115 may not overlap with the pixel driving circuit DC of the corresponding pixel area PA. For example, the thin film transistors T1, T2 and T3 of each pixel area PA may be disposed outside the emission area EA of the corresponding pixel area PA. Thus, in the display apparatus according to the example embodiment of the present disclosure, the light emitted from the light-emitting device 150 of each pixel area PA may be not blocked by the thin film transistors T1, T2 and T3 of the corresponding pixel area PA.

The light-emitting layer 152 of each light-emitting device 150 may be connected to the light-emitting layer 152 of adjacent light-emitting device 150. For example, the light-emitting layer 152 of each light-emitting device 150 may extend on the bank insulating layer 115. The light emitted from the light-emitting device 150 of each pixel area PA may display the same color as the light emitted from the light-emitting device 150 of adjacent pixel area PA. For example, the light-emitting layer 152 of each pixel area PA may generate white light.

Each of the pixel areas PA may realize a color different from adjacent pixel area PA. For example, each of the pixel area PA may include a color filter 160 overlapping with the emission area EA of the corresponding pixel area PA. The color filter 160 may realize a specific color using the light passing through the corresponding color filter 160. For example, the color filter 160 of each pixel area PA may be disposed on a path of the light emitted from the light-emitting device 150 in the corresponding pixel area PA. The color filter 160 of each pixel area PA may be disposed between the device substrate 101 and the light-emitting device 150 of the corresponding pixel area PA. For example, the color filter 160 of each pixel area PA may be disposed between the device passivation layer 113 and the over-coat layer 114. A thickness difference due to the color filter 160 of each pixel area PA may be removed by the over-coat layer 114.

A voltage applied to the second electrode 153 of each light-emitting device 150 may be the same as a voltage applied to the second electrode 153 of adjacent light-emitting device 150. For example, the second electrode 153 of each light-emitting device 150 may be electrically connected to the second electrode 153 of adjacent light-emitting device 150. The second electrode 153 of each light-emitting device 150 may include the same material as the second electrode 153 of adjacent light-emitting device 150. For example, the second electrode 153 of each light-emitting device 150 may be formed simultaneously with the second electrode 153 of adjacent light-emitting device 150. Thus, in the display apparatus according to the example embodiment of the present disclosure, a process of forming the second electrode 153 of each light-emitting device 150 may be simplified.

In one or more examples, the second electrode 153 of the light-emitting device 150 may be connected to a node or a line for coupling to a power voltage supply (e.g., a ground as shown in FIG. 2).

A light-blocking pattern 140 may be disposed between the device substrate 101 and each thin film transistor T1, T2 and T3. For example, the light-blocking pattern 140 may be disposed between the device substrate 101 and the device buffer layer 111. The light-blocking pattern 140 may include a material capable of absorbing or reflecting light. The light-blocking pattern 140 may include a conductive material. For example, the light-blocking pattern 140 may include a metal, such as aluminum (Al), chrome (Cr), copper (Cu), molybdenum (Mo), titanium (Ti), tungsten (W), an alloy of any of the foregoing, or some combination thereof.

External light travelling in a direction of the semiconductor pattern 121 and 131 of each thin film transistor T1, T2 and T3 may be blocked by the light-blocking pattern 140. For example, the light-blocking pattern 140 may include a portion overlapping with the channel region of each semiconductor pattern 121 and 131. The gate electrode 122 and 132 of each thin film transistor T1, T2 and T3 may overlap a portion of the light-blocking pattern 140. Thus, in the display apparatus according to the example embodiment of the present disclosure, a change in characteristics of each thin film transistor T1, T2 and T3 due to the external light may be prevented.

The first thin film transistor T1 of each pixel driving circuit DC may transmit the data signal to the second thin film transistor T2 of the corresponding pixel driving circuit DC. For example, the first gate electrode of each pixel driving circuit DC may be electrically connected to one of the gate lines GL, and the first source electrode of each pixel driving circuit DC may be electrically connected to one of the data lines DL. The second thin film transistor T2 of each pixel driving circuit DC may generate the driving current corresponding to the data signal. For example, the second gate electrode 122 of each pixel driving circuit DC may be electrically connected to the first drain electrode of the corresponding pixel driving circuit DC, and the second source electrode 123 of each pixel driving circuit DC may be electrically connected to one of the power voltage supply lines PL. The driving current generated by the second thin film transistor T2 of each pixel area PA may be provided to the light-emitting device 150 of the corresponding pixel area PA. For example, the first electrode 151 of each pixel area PA may be electrically connected to the second drain electrode 124 of the corresponding pixel area PA.

The data lines DL may intersect the gate lines GL. The data lines DL may be disposed on a layer different from the gate lines GL. For example, the data lines DL may be disposed between the device substrate 101 and the device buffer layer 111. The data lines DL may include the same material as the light-blocking pattern 140. For example, the data lines DL may be formed simultaneously with the light-blocking pattern 140. The device buffer layer 111 and the gate insulating layer 112 may include data contact holes exposing a portion of each data line DL. The first source electrode of each pixel area PA may be connected to the corresponding data line DL through one of the data contact holes.

The power voltage supply lines PL may extend in parallel to the data lines DL. For example, the power voltage supply lines PL may intersect the gate lines GL. The power voltage supply lines PL may be disposed on the same layer as the data lines DL. For example, the power voltage supply lines PL may be disposed between the device substrate 101 and the device buffer layer 111. The power voltage supply lines PL may include the same material as the data lines DL. For example, the power voltage supply lines PL may be formed simultaneously with the data lines DL. The device buffer layer 111 and the gate insulating layer 112 may include power contact holes exposing a portion of each power voltage supply line PL. The second source electrode 123 of each pixel area PA may be connected to the corresponding power voltage supply line PL through one of the power contact holes.

The storage capacitor Cst of each pixel driving circuit DC may maintain a signal applied to the second gate electrode 122 of the corresponding pixel driving circuit DC for one frame. For example, the storage capacitor Cst of each pixel driving circuit DC may be electrically connected between the second gate electrode 122 and the second drain electrode 124 of the corresponding pixel driving circuit DC. The storage capacitor Cst of each pixel driving circuit DC may have a stacked structure of at least two capacitor electrodes 171 and 172. For example, the storage capacitor Cst of each pixel driving circuit DC may have a stacked structure of a first capacitor electrode 171 and a second capacitor electrode 172. The second capacitor electrode 172 of each pixel driving circuit DC may be disposed on the first capacitor electrode 171 of the corresponding pixel driving circuit DC. The second capacitor electrode 172 of each pixel driving circuit DC may be insulated from the first capacitor electrode 171 of the corresponding pixel driving circuit DC. The storage capacitor Cst of each pixel driving circuit DC may be formed using a conductive layer disposed between the device substrate 101 and the over-coat layer 114. For example, the first capacitor electrode 171 of each pixel driving circuit DC may be disposed between the device substrate 101 and the device buffer layer 111, and the second capacitor electrode 172 of each pixel driving circuit DC may be disposed between the device buffer layer 111 and the gate insulating layer 112.

The first capacitor electrode 171 of each pixel driving circuit DC may include the same material as the light-blocking pattern 140. For example, the first capacitor electrode 171 of each pixel driving circuit DC may include a metal, such as aluminum (Al), chrome (Cr), copper (Cu), molybdenum (Mo), titanium (Ti), tungsten (W), an alloy of any of the foregoing, or some combination thereof. The first capacitor electrode 171 of each pixel driving circuit DC may be formed simultaneously with the light-blocking pattern 140. For example, the first capacitor electrode 171 of each pixel driving circuit DC may be in direct contact with the light-blocking pattern 140 disposed in the corresponding pixel area PA.

The first capacitor electrode 171 of each pixel driving circuit DC may be electrically connected to the second drain electrode 124 of the corresponding pixel driving circuit DC. For example, the first capacitor electrode 171 of each pixel driving circuit DC may be connected to the second drain electrode 124 of the corresponding pixel driving circuit DC by the light-blocking pattern 140 and the drain region of the second semiconductor pattern 121, which are disposed in the corresponding pixel area PA. The drain region of the second semiconductor pattern 121 in each pixel area PA may be electrically connected to the light-blocking pattern 140 in the corresponding pixel area PA. For example, the device buffer layer 111 may include storage contact holes between the light-blocking pattern 140 and the drain region of the second semiconductor pattern 121 in each pixel area PA. The drain region of the second semiconductor pattern 121 in each pixel area PA may be connected to the light-blocking pattern 140 in the corresponding pixel area PA through one of the storage contact holes.

The second capacitor electrode 172 of each pixel driving circuit DC may include the same material as the semiconductor patterns 121 and 131 of the corresponding pixel driving circuit DC. For example, the second capacitor electrode 172 of each pixel driving circuit DC may include an oxide semiconductor, such as IGZO. The second capacitor electrode 172 of each pixel driving circuit DC may be formed simultaneously with the semiconductor patterns 121 and 131 of the corresponding pixel driving circuit DC. The second capacitor electrode 172 of each pixel driving circuit DC may have a resistance lower than the channel region of each semiconductor pattern 121 and 131 disposed in the corresponding pixel driving circuit DC. For example, the second capacitor electrode 172 of each pixel driving circuit DC may include a conductorized region of an oxide semiconductor.

The third thin film transistor T3 of each pixel driving circuit DC may reset the storage capacitor Cst of the corresponding pixel driving circuit DC according to the gate signal. For example, the third gate electrode 132 of each pixel driving circuit DC may be electrically connected to one of gate lines GL, the third source electrode 133 of each pixel driving circuit DC may be electrically connected to one of the reference voltage supply lines RL, and the third drain electrode 134 of each pixel driving circuit DC may be electrically connected to the storage capacitor Cst of the corresponding pixel driving circuit DC. The third gate electrode 132 of each pixel driving circuit DC may be connected to one of gate line GLs, and the first gate electrode of the corresponding pixel driving circuit DC may be connected to the same one of the gate line GLs. Stated in another way, for each pixel driving circuit DC, a corresponding third gate electrode 132 and a corresponding first gate electrode may be connected to a same corresponding gate line GL. For example, the first thin film transistor T1 and the third thin film transistor T3 of each pixel driving circuit may be turn-on/off, simultaneously.

The reference voltage supply lines RL may extend in parallel to the power voltage supply lines PL. For example, the reference voltage supply lines RL may intersect the gate lines GL. The reference voltage supply liens RL may be disposed on the same layer as the power voltage supply lines PL. For example, the reference voltage supply lines RL may be disposed between the device substrate 101 and the device buffer layer 111. The reference voltage supply lines RL may include the same material as the power voltage supply lines PL. For example, the reference voltage supply lines RL may be formed simultaneously with the power voltage supply lines PL. The device buffer layer 111 and the gate insulating layer 112 may include reference contact holes exposing a portion of each reference voltage supply lines RL. The third source electrode 133 of each pixel area PA may be connected to the corresponding reference voltage supply line RL through one of the reference contact holes.

The display panel 100 may include a display area AA in which the pixel areas PA are disposed, and a bezel area BZ disposed outside the display area AA. For example, the bezel area BZ may surround the display area AA. Signal wirings DL, GL, PL and RL may be disposed in the bezel area BZ to transmit various signals for controlling the light-emitting device 150 of each pixel area PA. For example, the data lines DL, the gate lines GL, the power voltage supply lines PL and the reference voltage supply lines RL, which are electrically connected to the pixel driving circuit DC of each pixel area PA may extend on the bezel area BZ of the device substrate 101. The device substrate 101 of the display panel 100 may be provided in (or may extend in or may extend throughout) the display area AA as well as the bezel area BZ.

Figure 4:
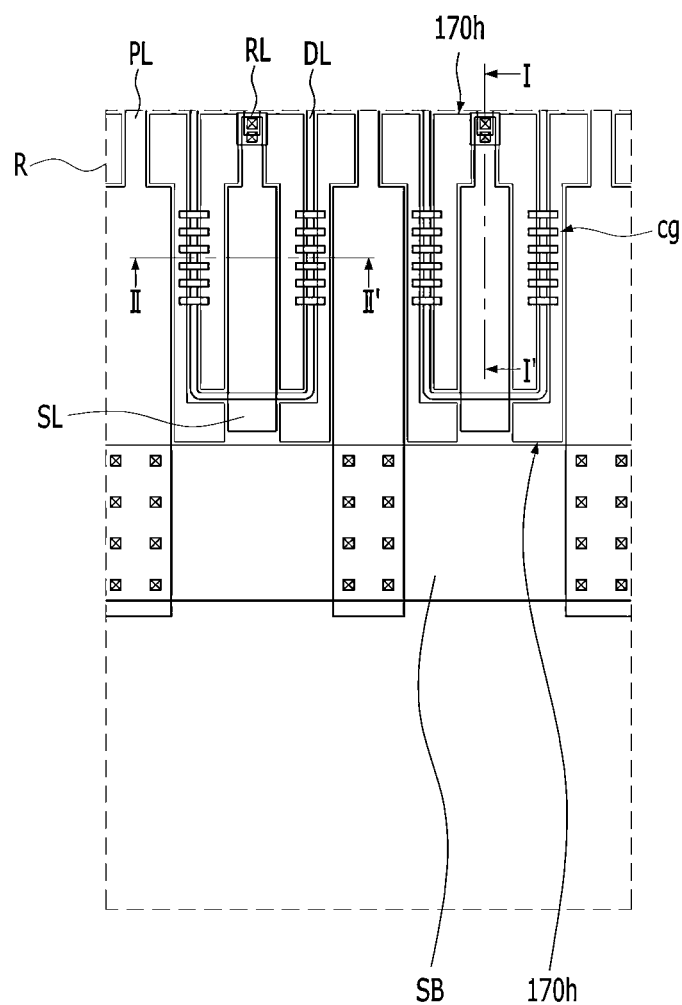
FIG. 4 is an example of an enlarged view of R region in FIG. 1.
Figure 5:
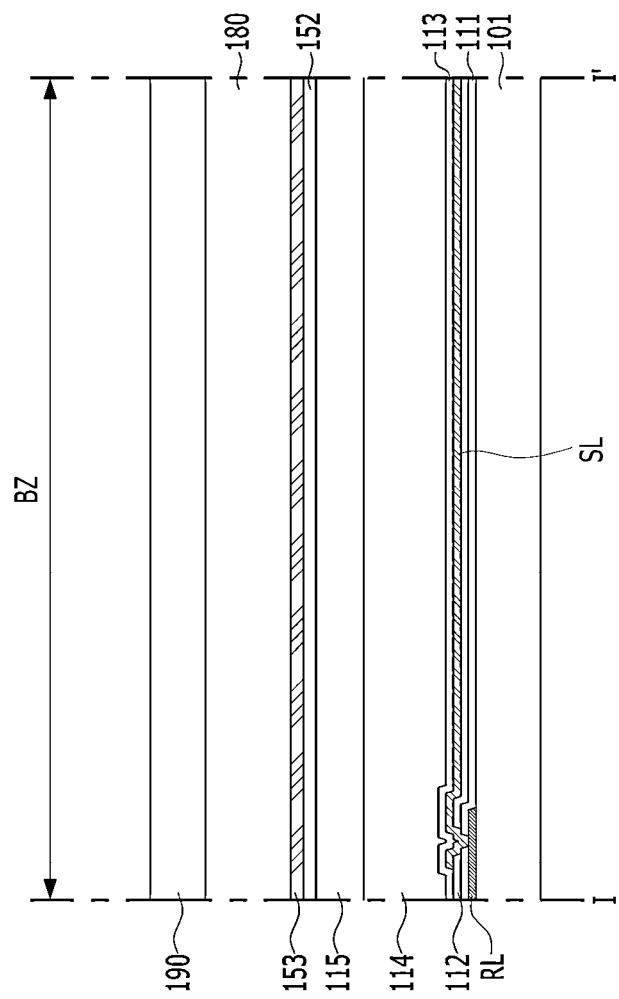
FIG. 5 is an example of a view taken along I-I' of FIG. 4.
Figure 6:
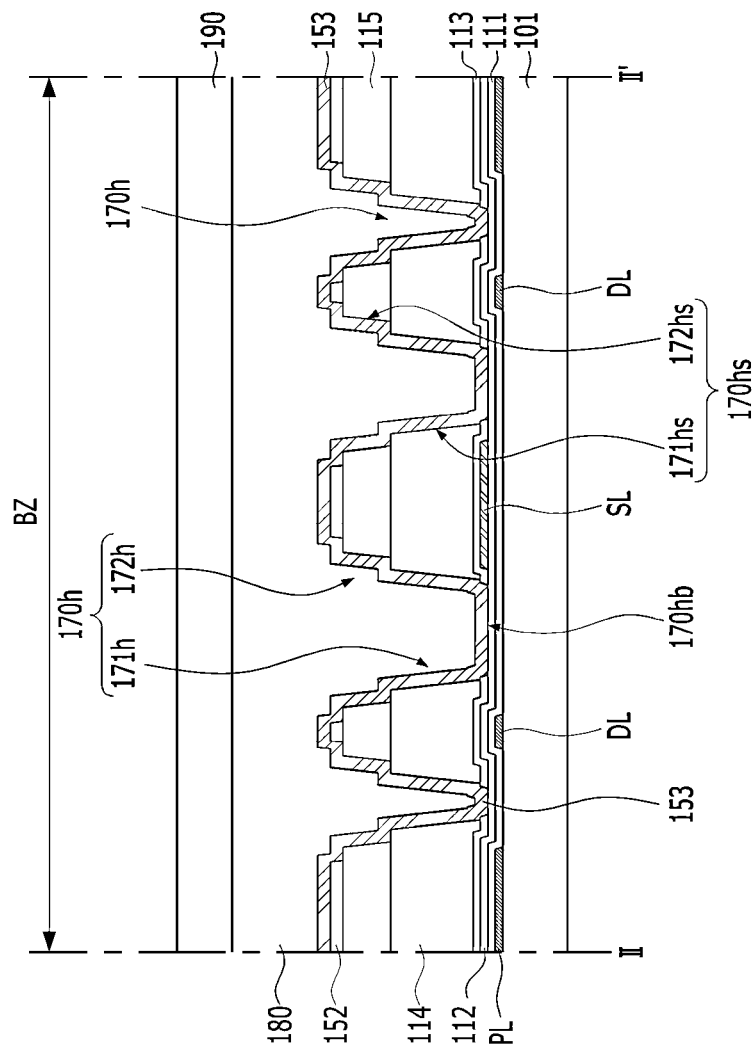
FIG. 6 is an example of a view taken along II-II' of FIG. 4.

FIG. 4 is an example of an enlarged view of R region in FIG. 1. FIG. 5 is an example of a view taken along I-I' of FIG. 4. FIG. 6 is an example of a view taken along II-II' of FIG. 4.

Referring to FIGS. 1 to 6, in the display apparatus according to the example embodiment of the present disclosure, at least one of the insulating layers 111, 112, 113, 114 and 115 may be disposed on the bezel area BZ of the device substrate 101. For example, the device buffer layer 111, the gate insulating layer 112, the device passivation layer 113, the over-coat layer 114 and the bank insulating layer 115 may extend on the bezel area BZ of the device substrate 101. The device buffer layer 111, the gate insulating layer 112, the device passivation layer 113, the over-coat layer 114 and the bank insulating layer 115 may be sequentially stacked on the bezel area BZ of the device substrate 101.

An end of each data line DL may be disposed on the bezel area BZ of the device substrate 101. For example, separating grooves cg may be disposed in the bezel area BZ for separating each data line DL from adjacent data line DL. The separating grooves cg may be filled with the insulating layers 112, 113, 114 and 115, which are stacked on the data lines DL. For example, a process of forming the data lines DL may include a step of forming conductive lines so that two adjacent lines are connected to each other in the bezel region BZ, a step of testing states of the conductive lines, a step of forming the data lines DL by forming separating grooves cg to cut a portion of each conductive line on the bezel region BZ, and a step of filling the separating grooves cg with the device buffer layer 111 which is formed by a subsequent process. Thus, in the display apparatus according to the example embodiment of the present disclosure, a defect rate of the data lines DL may be significantly reduced.

At least one power voltage shorting bar SB may be disposed on the bezel area BZ of the device substrate 101. The power voltage shorting bar SB may be connected between the power voltage supply lines PL. Thus, in the display apparatus according to the example embodiment of the present disclosure, the power voltage applied through the power voltage supply lines PL may be constantly maintained. The power voltage shorting bar SB may intersect the power voltage supply lines PL. For example, the power voltage supply lines PL may extend in a first direction, and the power voltage shorting bar SB may extend in a second direction perpendicular to the first direction.

The power voltage shorting bar SB may include a conductive material. The power voltage shorting bar SB may include a material having a low resistance. For example, the power voltage shorting bar SB may include a metal, such as aluminum (Al), chrome (Cr), copper (Cu), molybdenum (Mo), titanium (Ti), tungsten (W), an alloy of any of the foregoing, or some combination thereof. The power voltage shorting bar SB may be disposed on a layer different from the power voltage supply lines PL. For example, the power voltage shorting bar SB may be disposed between the gate insulating layer 112 and the device passivation layer 113. The power voltage shorting bar SB may include a material different from the power voltage supply lines PL. The power voltage shorting bar SB may include the same material as the gate electrodes 122 and 132 of each pixel driving circuit DC. For example, the power voltage shorting bar SB may be formed simultaneously with the gate electrodes 122 and 132 of each pixel driving circuit DC.

The device buffer layer 111 and the gate insulating layer 112 may include power connecting holes exposing a portion of each power voltage supply line PL in the bezel area BZ. The power voltage shorting bar SB may be connected to each power voltage supply line PL through the power connecting holes.

Moisture blocking holes 170h may be disposed on the bezel area BZ of the device substrate 101. The moisture blocking holes 170h may penetrate insulating layers 114 and 115, which are made of an organic insulating material. For example, the moisture blocking holes 170h may penetrate the over-coat layer 114 and the bank insulating layer 115 of the bezel area BZ. Each of the moisture blocking holes 170h may penetrate the device passivation layer 113 being in contact with a lower surface of the over-coat layer 114 toward the device substrate 101. In this regard, in an example, the over-coat layer 114 and the bank insulating layer 115 may be etched so that the moisture blocking holes 170h may penetrate the over-coat layer 114 and the bank insulating layer 115. In addition, the device passivation layer 113 may be etched so that the moisture blocking holes 170h may penetrate the device passivation layer 113. Thus, in the display apparatus according to the example embodiment of the present disclosure, a portion of the over-coat layer 114 and a portion of the bank insulating layer 115, which are disposed in the bezel area BZ, may be completely removed in order to form the moisture blocking holes 170h. For example, each of the moisture blocking holes 170h may include a lower blocking hole 171h completely penetrating the over-coat layer 114 and an upper blocking hole 172h completely penetrating the bank insulating layer 115.

The second electrode 153 of each light-emitting device 150 may be electrically connected to the power unit 500 in the bezel area BZ. For example, the light-emitting layer 152 and the second electrode 153 of each light-emitting device 150 may extend beyond the display area AA. The light-emitting layer 152 and the second electrode 153 may be sequentially stacked on the bank insulating layer 115 of the bezel area BZ.

The second electrode 153 may extend on (or may cover) sidewalls 170hs of the moisture blocking holes 170h. For example, the sidewall 170hs of each moisture blocking hole 170h may be completely covered by the second electrode 153. A sidewall 170hs of each moisture blocking hole 170h may include an upper sidewall 172hs and a lower sidewall 171hs. Further, the second electrode 153 may extend (or may cover, may completely cover, or may be in direct contact with) the bottom surfaces 170hb of the moisture blocking holes 170h. The second electrode 153 may be in direct contact with the gate insulating layer 112 in each moisture blocking hole 170h. Thus, in the display apparatus according to the example embodiment of the present disclosure, the external moisture penetrating through the over-coat layer 114 and the bank insulating layer 115 of the bezel area BZ may be blocked or delayed by the moisture blocking holes 170h and the second electrode 153.

The light-emitting layer 152 of the bezel area BZ may be only disposed on the bank insulating layer 115. For example, the sidewall 170hs of each moisture blocking hole 170h may be in direct contact with (or covered by) the second electrode 153. Thus, in the display apparatus according to the example embodiment of the present disclosure, the penetration of the external moisture due to a layer made of an organic material may be effectively blocked or delayed.

The moisture blocking holes 170h may be disposed between the signal wirings DL, GL, PL and RL. For example, each of the moisture blocking holes 170h may extend in the same direction as the signal wirings DL, GL, PL and RL. The moisture blocking holes 170h may be disposed between the display area AA and the power voltage shorting bar SB. For example, the power voltage shorting bar SB may not overlap the moisture blocking holes 170h. Thus, in the display apparatus according to the example embodiment of the present disclosure, a short-circuit between the signal wirings DL, GL, PL and RL and the power voltage shorting bar SB due to the moisture blocking holes 170*h* may be prevented.

Sensing lines SL may be disposed on the bezel area BZ of the device substrate 101. The sensing lines SL may detect short-circuit of the signal wirings DL, GL, PL and RL. For example, the short-circuit due to a crack generated in at least a portion of the device substrate 101 and/or the insulating layers 111, 112, 113, 114 and 115 disposed on the device substrate 101 due to external stress may be detected by the sensing lines SL.

The sensing lines SL may be disposed between the signal wirings DL, GL, PL and RL. For example, each of the sensing lines SL may be disposed between data lines DL, which are separated by the separating grooves cg. The sensing lines SL may extend in the same direction as adjacent signal wirings DL, GL, PL and RL. For example, the sensing lines SL may extend in parallel to the data lines DL. The moisture blocking holes 170*h* may be disposed outside the sensing lines SL. For example, the moisture blocking holes 170*h* may be disposed between the sensing lines SL and the signal wirings DL, GL, PL and RL. The moisture blocking holes 170*h* may be spaced away from the separating grooves cg. Thus, the display apparatus according to the example embodiment of the present disclosure may block or delay the penetration of the external moisture without affecting the short-circuit detection using the sensing lines SL.

The sensing lines SL may include a conductive material. The sensing lines SL may include a material having a low resistance. For example, the sensing lines SL may include a metal, such as aluminum (Al), chrome (Cr), copper (Cu), molybdenum (Mo), titanium (Ti), tungsten (W), an alloy of any of the foregoing, or some combination thereof. Each of the sensing lines SL may be electrically connected to one of the signal wirings DL, GL, PL and RL, which are electrically connected to each pixel area PA. The signal wiring DL, GL, PL and RL being electrically connected to the sensing lines SL may supply a signal of a constant voltage to each pixel area PA. For example, the sensing lines SL may be electrically connected to the reference voltage supply lines RL. Thus, the display apparatus according to the example embodiment of the present disclosure may detect the short-circuit of the signal wirings DL, GL, PL and RL using the sensing lines SL, without changing the density of the signal wirings DL, GL, PL and RL.

The sensing lines SL may be disposed on a layer different from the reference voltage supply lines RL. For example, the sensing lines SL may be disposed between the gate insulating layer 112 and the device passivation layer 113. The device buffer layer 111 and the gate insulating layer 112 may include contact holes partially exposing an end of each reference voltage supply line RL. Each of the sensing lines SL may be in direct contact with the corresponding reference voltage supply line RL through one of the detecting contact holes. The sensing lines SL may include the same material as the gate electrodes 122 and 132 of each pixel driving circuit DC. For example, the sensing lines SL may be formed simultaneously with the gate electrodes 122 and 132 of each pixel driving circuit DC.

An encapsulation substrate 190 may be disposed on the second electrode 153 of each light-emitting device 150. The encapsulation substrate 190 may prevent the damage of the light-emitting devices 150 due to the external impact and moisture. For example, the encapsulation substrate 190 may include a material having a specific hardness. For example, the encapsulation substrate 190 may include a material having relatively high thermal conductivity. For example, the encapsulation substrate 190 may include a metal, such as aluminum (Al), nickel (Ni), iron (Fe) an alloy of any of the foregoing, or some combination thereof. Thus, in the display apparatus according to the example embodiment of the present disclosure, the heat generated by the pixel driving circuit DC and the light-emitting device 150 of each pixel area PA may be dissipated through the encapsulation substrate 190. Therefore, in the display apparatus according to the example embodiment of the present disclosure, the deterioration of the light-emitting layers 152 may be minimized.

The encapsulation substrate 190 may be attached on the device substrate 101 in which the light-emitting devices 150 are formed. For example, an encapsulating element 180 may be disposed in a space between the light-emitting devices 150 and the encapsulation substrate 190. The encapsulating element 180 may include an adhesive material. The encapsulating element 180 may include an insulating material. For example, the encapsulating element 180 may include an olefin-based material. The encapsulating element 180 may have a relatively low water vapor transmission rate (WVTR). Thus, in the display apparatus according to the example embodiment of the present disclosure, the penetration of the external moisture through the encapsulating element 180 may be prevented.

The encapsulating element 180 and the encapsulation substrate 190 may extend on the bezel area BZ of the device substrate 101. For example, the moisture blocking holes 170*h* may be filled with the encapsulating element 180. Thus, in the display apparatus according to the example embodiment of the present disclosure, the external moisture penetrating through the over-coat layer 114 and the bank insulating layer 115 of the bezel area BZ may be blocked or delayed by the moisture blocking holes 170*h*, the second electrode 153 and the encapsulating element 180.

Accordingly, the display apparatus according to the example embodiment of the present disclosure may include the light-emitting devices 150 on the display area AA of the device substrate 101, the signal wirings DL, GL, PL and RL between the device substrate 101 and the light-emitting devices 150, and the insulating layers 111, 112, 113, 114 and 115 insulating between the signal wirings DL, GL, PL and RL, wherein the signal wirings DL, GL, PL and RL, the insulating layers 111, 112, 113, 114 and 115 and the second electrode 153 of each light-emitting device 150 may extend on the bezel area BZ of the device substrate 101, and wherein the sidewalls of the over-coat layer 114 and the bank insulating layer 115 which include an organic insulating material among the insulating layers 111, 112, 113, 114 and 115 of the bezel area BZ, may be covered by the second electrode 153. Thus, in the display apparatus according to the example embodiment of the present disclosure, the penetration of the external moisture through the insulating layer made of an organic insulating material may be blocked or delayed. Therefore, in the display apparatus according to the example embodiment of the present disclosure, the deterioration of the light-emitting layer 152 and the quality degradation of the image provided to the user due to the penetration of the external moisture may be minimized.

The display apparatus according to the example embodiment of the present disclosure provides that the data driver 200, the gate driver 300, the timing controller 400 and the power unit 500 are disposed outside the display panel 100. However, in the display apparatus according to another example embodiment of the present disclosure, at least one of the data driver 200, the gate driver 300, the timing controller 400 and the power unit 500 may be disposed on the bezel area BZ of the display panel 100. For example, the display apparatus according to another example embodiment of the present disclosure may be a gate-in-panel (GIP) type display apparatus in which the gate driver 300 may be formed in the bezel area BZ of the display panel 100.

In the display apparatus according to another example embodiment of the present disclosure, the encapsulating element 180 may include moisture absorbing particles. Thus, in the display apparatus according to another embodiment of the present invention, the external moisture penetrating through the over-coat layer 114 and the bank insulating layer 115 of the bezel area BZ may be collected in the encapsulating element 180. Therefore, in the display apparatus according to another example embodiment of the present disclosure, the penetration of the external moisture may be effectively blocked or delayed.

Figure 7:
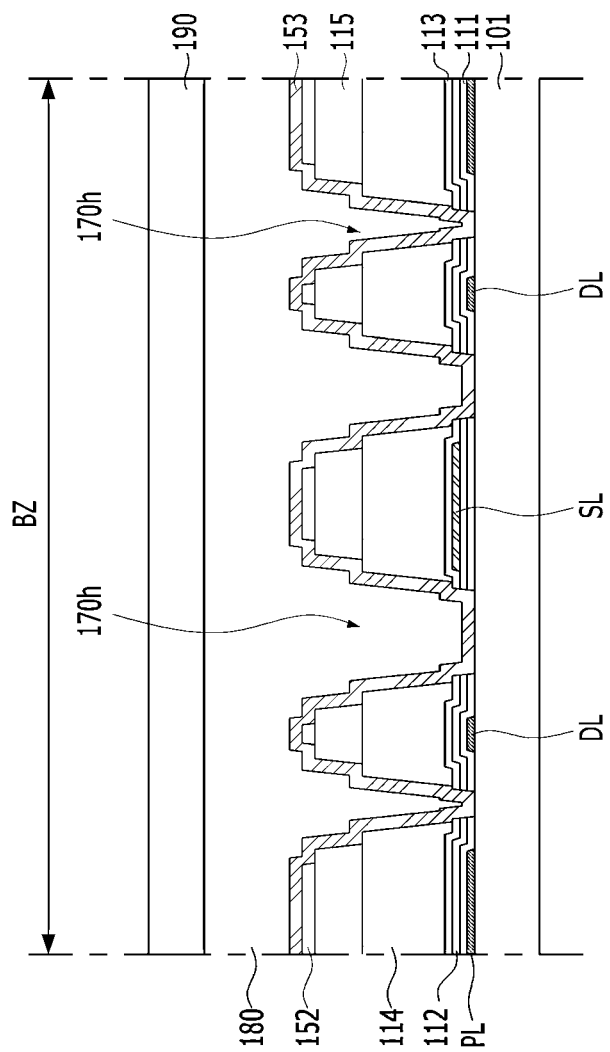
FIGS. 7 to 19 are views showing the display apparatus according to another example embodiment of the present disclosure.

The display apparatus according to the example embodiment of the present disclosure provides that the gate insulating layer 112 of the bezel area BZ may be partially exposed by the moisture blocking holes 170h. However, in the display apparatus according to another example embodiment of the present disclosure, the moisture blocking holes 170h may penetrate the device buffer layer 111, the gate insulating layer 112, the device passivation layer 113, the over-coat layer 114 and the bank insulating layer 115 of the bezel area BZ, as shown in FIG. 7. For example, in the display apparatus according to another example embodiment of the present disclosure, the bezel area BZ of the device substrate 101 may be partially exposed by the moisture blocking holes 170h. Thus, in the display apparatus according to another example embodiment of the present disclosure, the penetration of the external moisture may be effectively blocked or delayed by the moisture blocking holes 170h.

Figure 8:
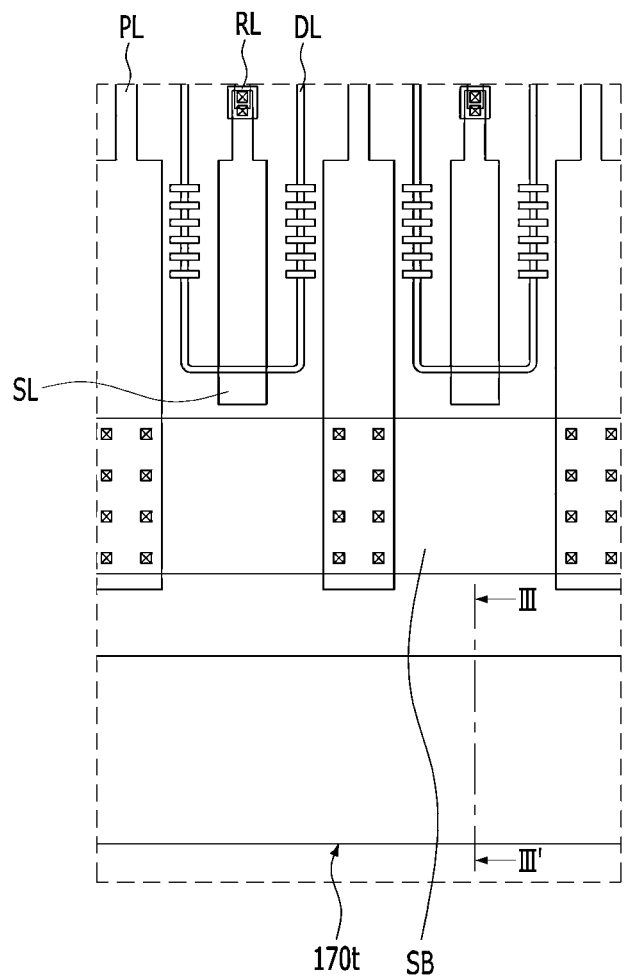
Figure 9:
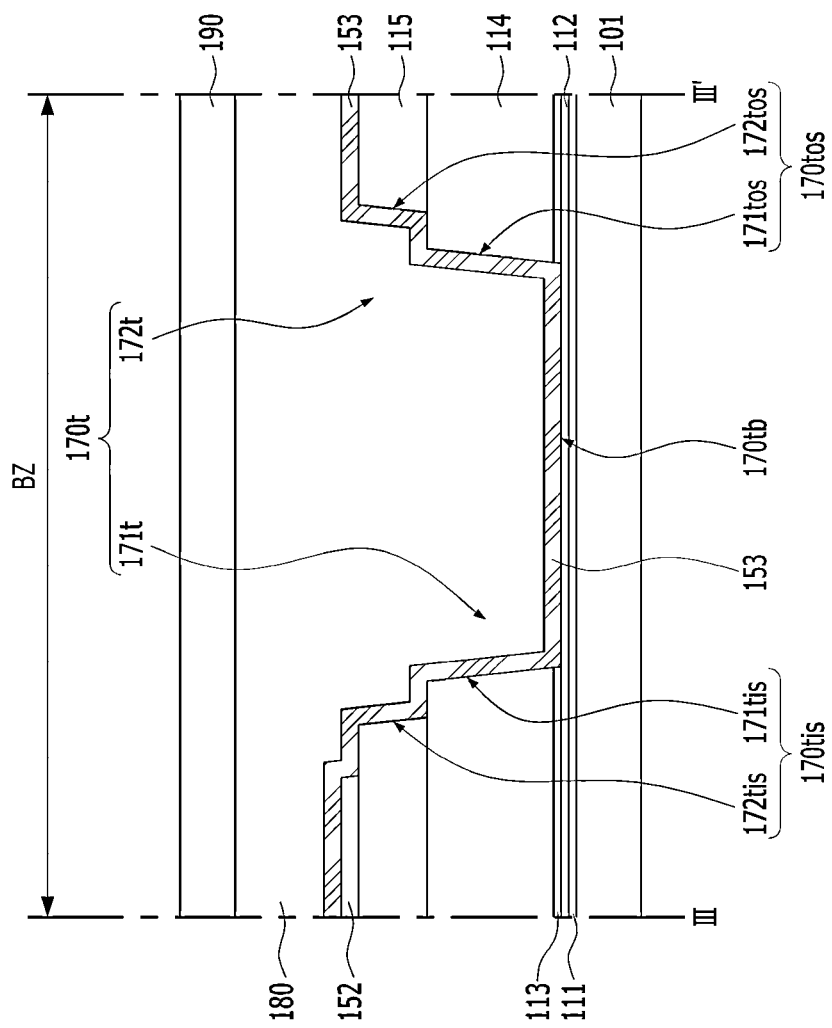

The display apparatus according to the example embodiment of the present disclosure provides that the moisture blocking holes 170h extending in the same direction as the signal wirings DL, GL, PL and RL are disposed on the bezel area BZ of the device substrate 101. However, the display apparatus according to another example embodiment of the present disclosure may block or delay the external moisture penetrating through the over-coat layer 114 and the bank insulating layer 115 of the bezel area BZ using various openings. For example, in the display apparatus according to the example embodiment of the present disclosure, a moisture blocking trench 170t penetrating the device passivation layer 113, the over-coat layer 114 and the bank insulating layer 115 of the bezel area BZ may be disposed outside the power voltage shorting bar SB, wherein the moisture blocking trench 170t may extend in parallel to the power voltage shorting bar SB, and wherein an inner sidewall 170tis of the moisture blocking trench 170t toward the display area AA may be covered by the second electrode 153 of each light-emitting device 150, as shown in FIGS. 8 and 9. That is, in the display apparatus according to another example embodiment of the present disclosure, the moisture blocking trench 170t including a lower trench 171t completely penetrating the over-coat layer 114 and an upper trench 172t completely penetrating the bank insulating layer 115 may extend along an edge of the display area AA. For example, the over-coat layer 114 and the bank insulating layer 115 in the bezel area BZ may be completely separated from the over-coat layer 114 and the bank insulating layer 115 in the display area AA by the moisture blocking trench 170t. Thus, in the display apparatus according to another embodiment of the present disclosure, the external moisture penetrating through the over-coat layer 114 and the bank insulating layer 115 in the bezel area BZ may be blocked by the moisture blocking trench 170t and the second electrode 153. Therefore, in the display apparatus according to another example embodiment of the present disclosure, the deterioration of the light-emitting layer 152 due to the penetration of the external moisture may be minimized. In this regard, an inner sidewall 170tis of the moisture blocking trench 170t may include an upper inner sidewall 172tis and a lower inner sidewall 171tis.

The second electrode 153 may extend on (or may cover or may be in direct contact with) an outer sidewall 170tos of the moisture blocking trench 170t opposite to the display area AA. For example, the second electrode 153 may extend along a surface of the moisture blocking trench 170t. Thus, in the display apparatus according to another example embodiment of the present disclosure, the degradation of the image quality due to the external moisture may be minimized. In one or more examples, an outer sidewall 170tos of the moisture blocking trench 170t may include an upper outer sidewall 172tos and a lower outer sidewall 171tos. In this regard, the second electrode 153 may extend on (or may cover or may be in direct contact with) a bottom surface 170tb of the moisture blocking trench 170t to minimize the penetration of the external moisture.

Figure 10:
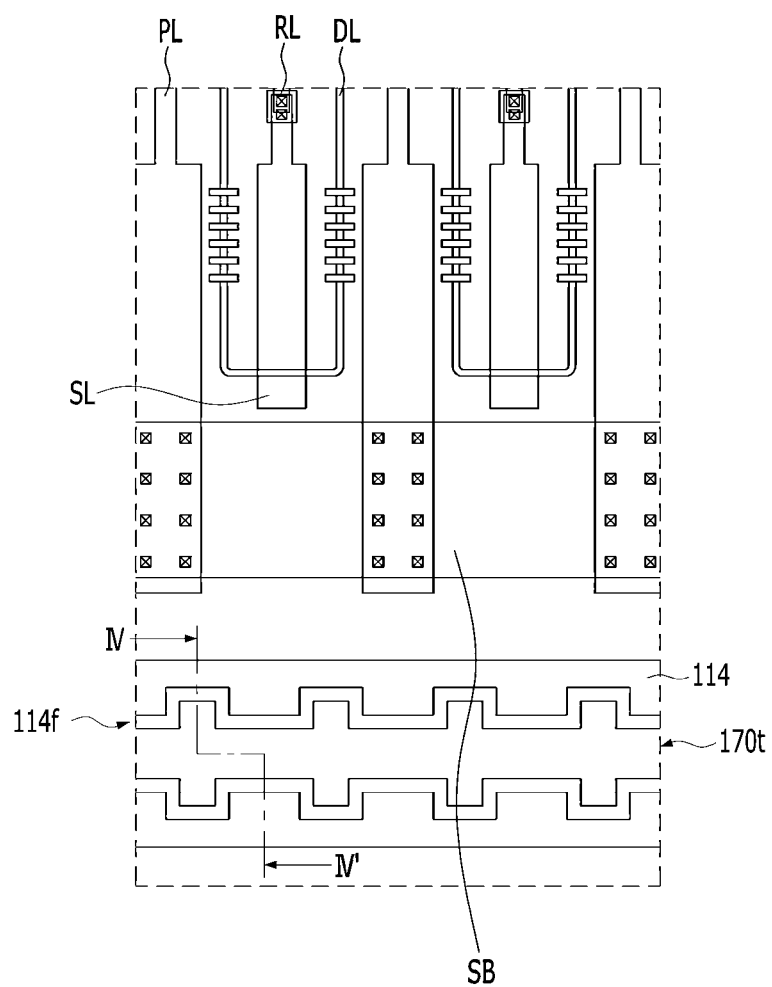
Figure 11:
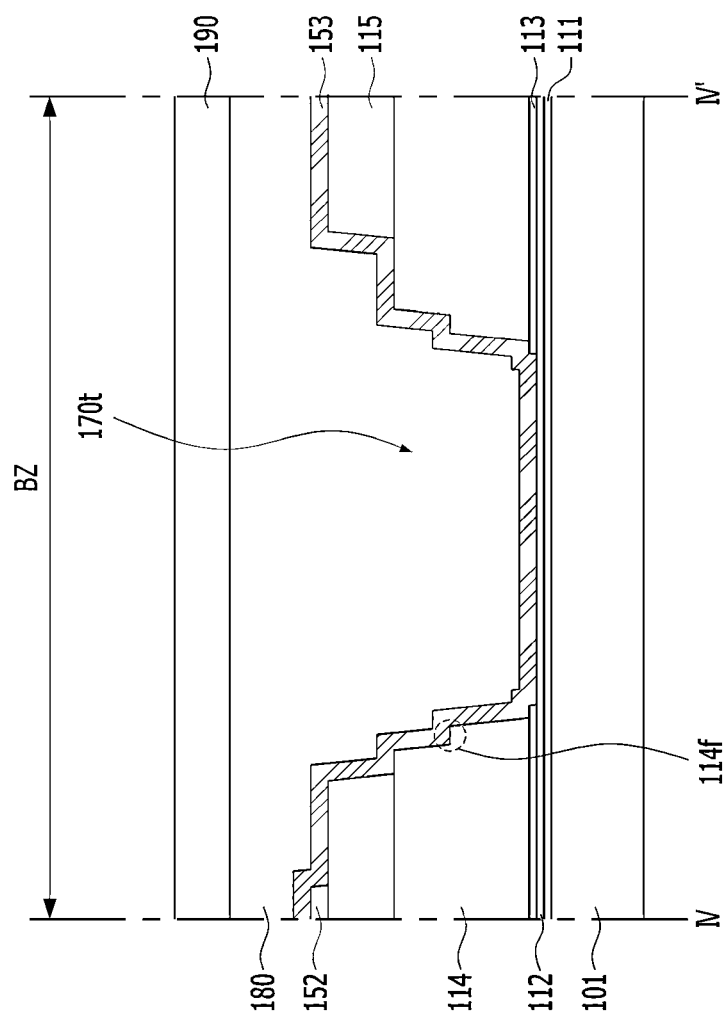

In the display apparatus according to another example embodiment of the present disclosure, the inner sidewall and the outer sidewall of the moisture blocking trench 170t may have various shapes. For example, in the display apparatus according to another example embodiment of the present disclosure, a planar shape of each of the inner sidewall and the outer sidewall of the moisture blocking trench 170t may be a concave-convex shape, as shown in FIGS. 10 and 11. Thus, in the display apparatus according to another example embodiment of the present disclosure, the penetration of the external moisture may be effectively blocked or delayed.

In the display apparatus according to another example embodiment of the present disclosure, each of the inner sidewall and the outer sidewall of the moisture blocking trench 170t may have a stepped shape. For example, each of the inner sidewall and the outer sidewall of the moisture blocking trench 170t may include a stepped portion 114f. The stepped portion 114f may be formed at the over-coat layer 114 of the bezel area BZ. The stepped portion 114f may be formed by a half-tone mask. For example, in the display apparatus according to another example embodiment of the present disclosure, a method of forming the moisture blocking trench 170t may include a step of locating the half-tone mask including a transparent region corresponding to a bottom surface of the moisture blocking trench 170t and a half-tone region corresponding to the stepped portion 114f on the over-coat layer 114, a step of exposing the over-coat layer 114 of the bezel area BZ using the half-tone mask, a step of forming the stepped portion 114f by removing a portion of the over-coat layer 114 which is exposed, and a step of forming the bank insulating layer 115 which includes an opening exposing the stepped portion 114f on the over-coat layer 114. Thus, in the display apparatus according to another example embodiment of the present disclosure, the second electrode 153 may be not disconnected on the inner sidewall and/or the outer sidewall of the moisture blocking trench 170t. That is, in the display apparatus according to another example embodiment of the present disclosure, the disconnection of the second electrode 153 due to the moisture blocking trench 170t may be prevented. Therefore, in the display apparatus according to another example embodiment of the present disclosure, the over-coat layer 114 and the bank insulating layer 115 may be formed to a sufficient thickness, and the inner sidewall and the outer sidewall of the moisture blocking trench 170t may be completely covered by the second electrode 153.

Figure 12:
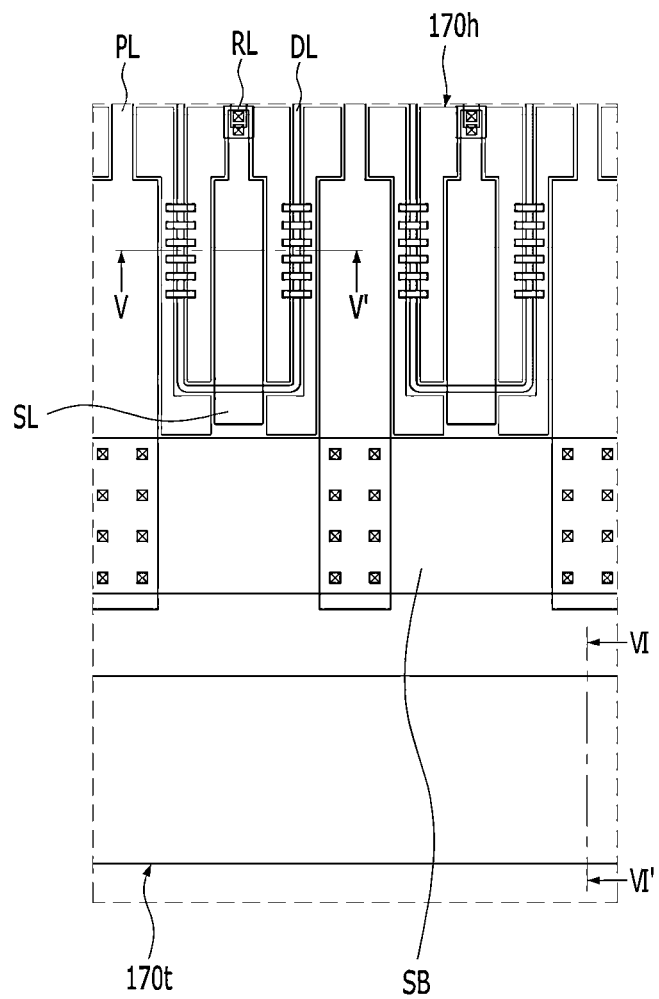

The display apparatus according to another example embodiment of the present disclosure may include the moisture blocking holes 170h between the signal wirings DL, PL and RL and the sensing lines SL, and the moisture blocking trench 170t disposed outside the power voltage shorting bar SB, as shown in FIG. 12. Thus, in the display apparatus according to another example embodiment of the present disclosure, the deterioration of the light-emitting layer 152 due to the external moisture may be significantly reduced.

Figure 13:
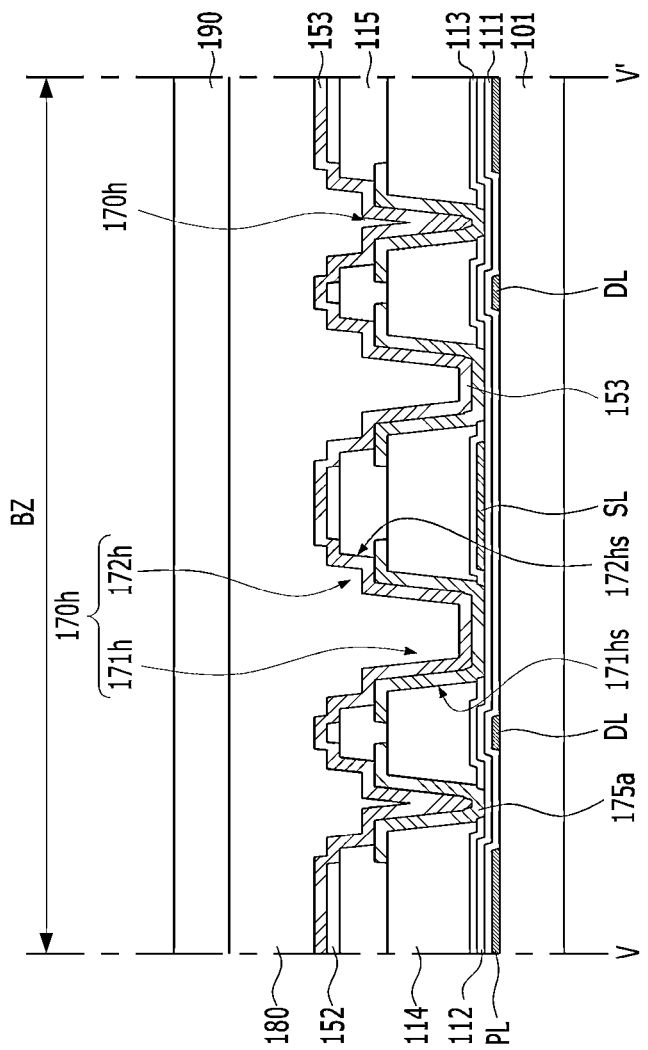
Figure 14:
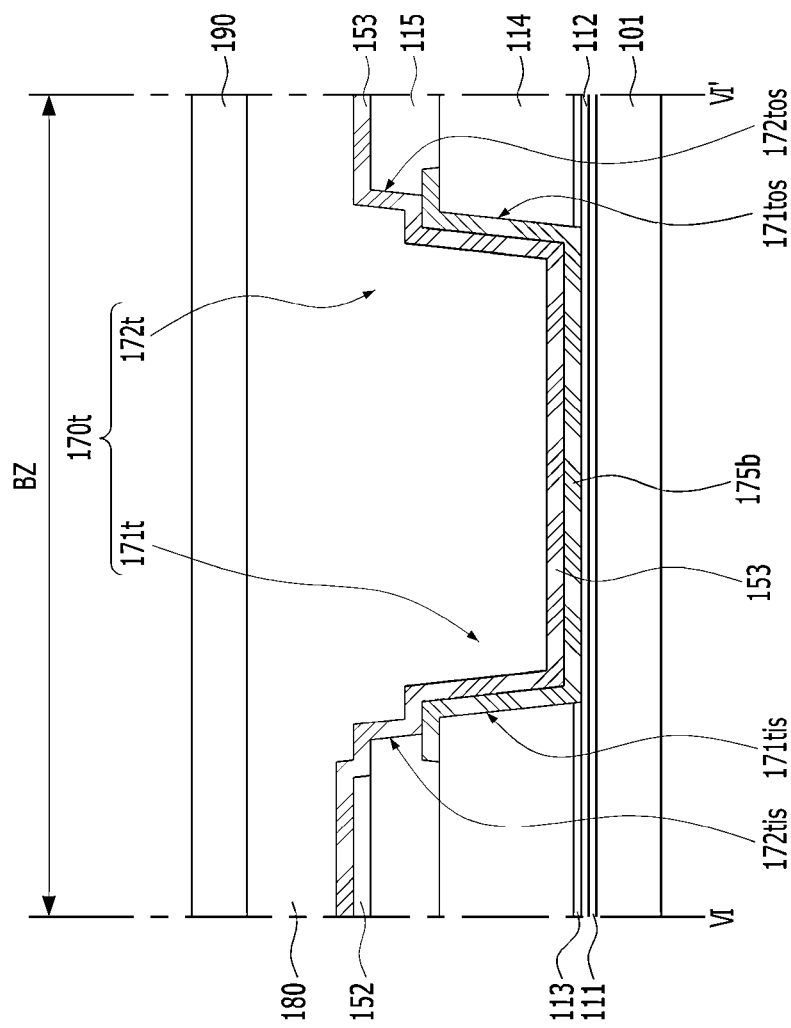

The display apparatus according to another example embodiment of the present disclosure may include a first blocking pattern 175a on the lower sidewall 171hs of each lower blocking hole 171h and a second blocking pattern 175b on the lower inner sidewall 171tis and the lower outer sidewall 171tos of each lower trench 171t, as shown in FIGS. 13 and 14. The first blocking patterns 175a and the second blocking patterns 175b may include a material capable of blocking or delaying moisture. The first blocking patterns 175a and the second blocking patterns 175b may be formed using a process of forming a layer between the over-coat layer 114 and the second electrode 153. For example, the first blocking patterns 175a and the second blocking patterns 175b may be simultaneously formed with the first electrode 151 of each light-emitting device. The first blocking patterns 175a and the second blocking patterns 175b may include the same material as the first electrode of each light-emitting device. In one or more aspects, the first and second blocking patterns 175a and 175b may be examples of moisture blocking patterns.

The first blocking patterns 175a and the second blocking patterns 175b may be spaced apart (or spaced away) from each other. For example, an end of each first blocking pattern 175a and an end of the second blocking pattern 175b may be disposed between the over-coat layer 114 and the bank insulating layer 115 of the bezel area BZ. The second electrode 153 may be in direct contact with (or may cover) the upper sidewall 172hs of each upper blocking hole 172h and the upper inner sidewall 172tis and the upper outer sidewall 172tos of each upper trench 172t. The second electrode 153 may be in direct contact with (or may cover) the first blocking patterns 175a and the second blocking patterns 175b in the lower blocking holes 171h and the lower trenches 171t, respectively. Thus, in the display apparatus according to another example embodiment of the present disclosure, the penetration of the external moisture may be effectively blocked or delayed.

Figure 15:
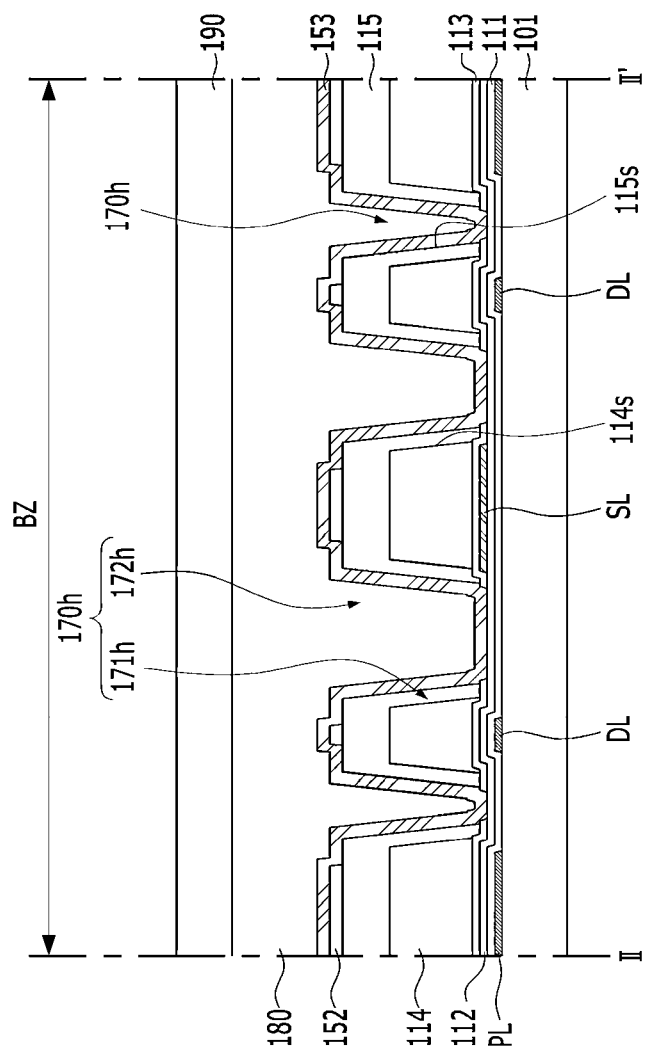
Figure 16:
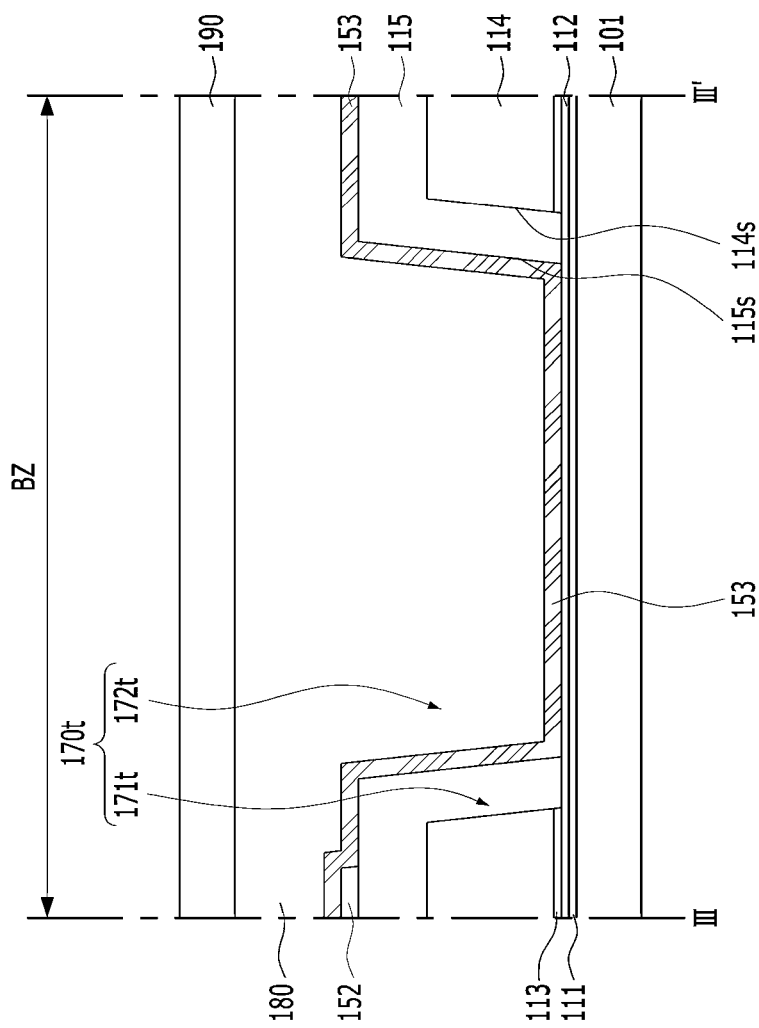

In the display apparatus according to another example embodiment of the present disclosure, the upper blocking hole 172h of each moisture blocking hole 170h may be disposed in the lower blocking hole 171h of the corresponding moisture blocking hole 170h, and the upper trench 172t of each moisture blocking trench 170t may be disposed in the lower trench 171t of the corresponding moisture blocking trench 170t, as shown in FIGS. 15 and 16. In this regard, the upper blocking hole 172h of each moisture blocking hole 170h may extend into the area of the lower blocking hole 171h of the corresponding moisture blocking hole 170h, and the upper trench 172t of each moisture blocking trench 170t may extend into the area of the lower trench 171t of the corresponding moisture blocking trench 170t. For example, the sidewalls 114s of the over-coat layer 114 exposed by the lower blocking holes 171h and the lower trenches 171t may be covered by the bank insulating layer 115. During fabrication, after the over-coat layer 114 is formed (or deposited), the over-coat layer 114 may be etched to form the sidewalls 114s and thus create the lower blocking holes 171h and the lower trenches 171t. Subsequently, the bank insulating layer 115 may be formed (or deposited) over the over-coat layer 114 and may cover the sidewalls 114s of the over-coat layer 114. Thereafter, the bank insulating layer 115 may be etched to form the sidewalls 115s and thus create the upper blocking holes 172h and the upper trenches 172t. The bank insulating layer 115 may have a water vapor transmission rate (WVTR) lower than the over-coat layer 114. Thus, in the display apparatus according to another example embodiment of the present disclosure, the deterioration of the light-emitting layer 152 due to the external moisture may be effectively improved.

Figure 17:
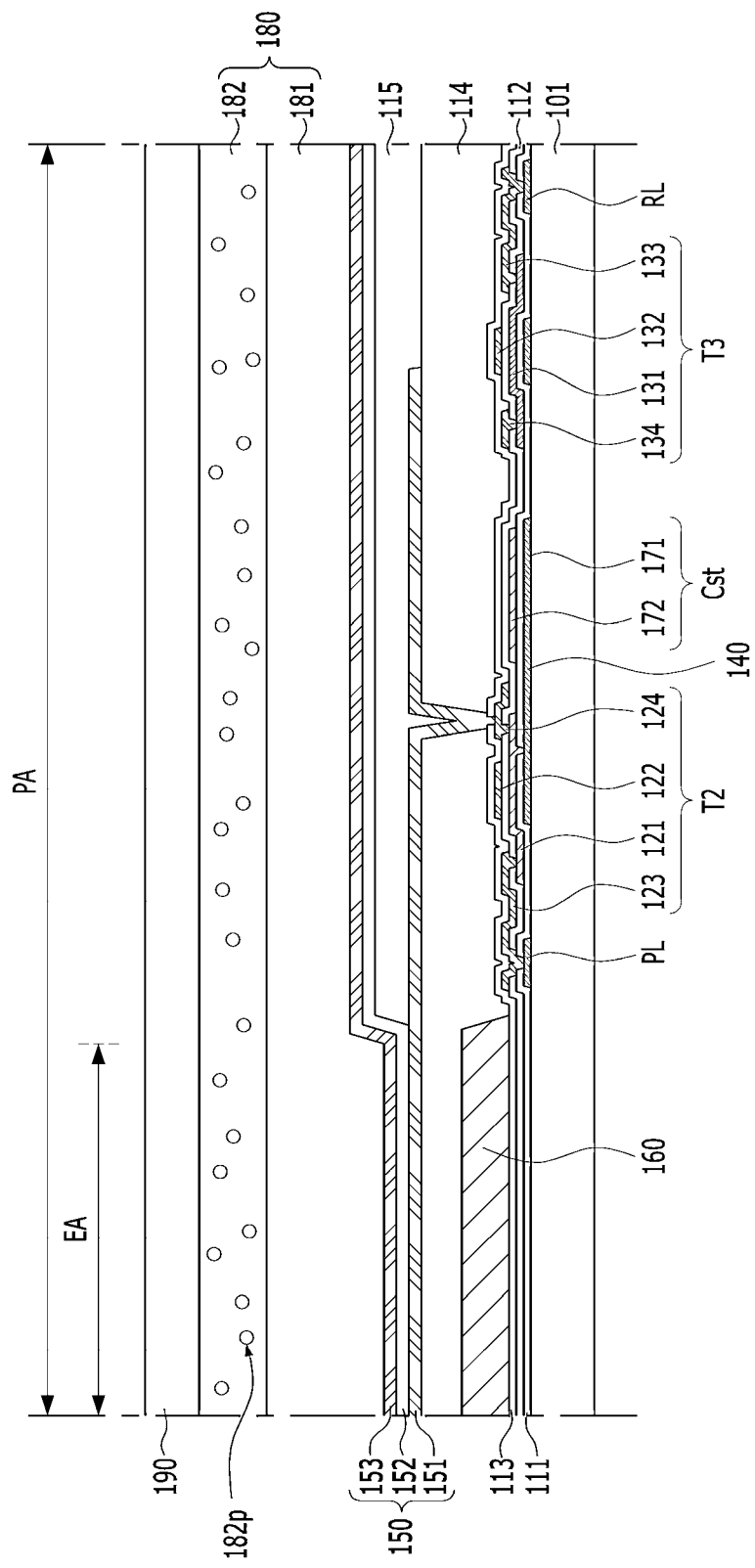
Figure 18:
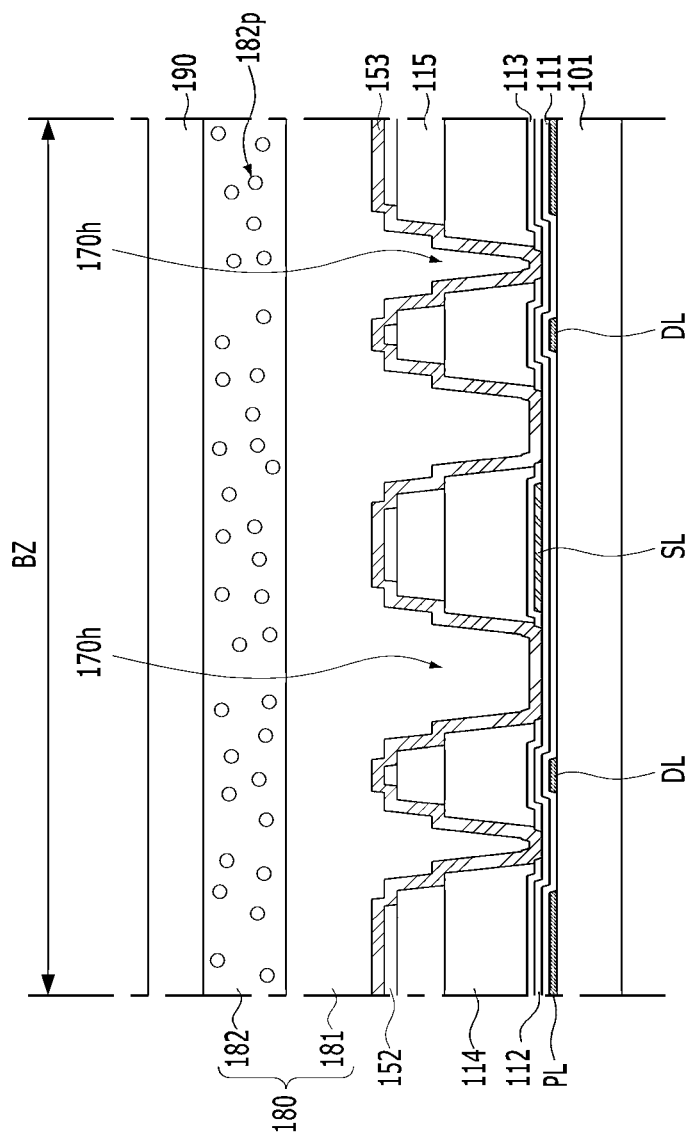
Figure 19:
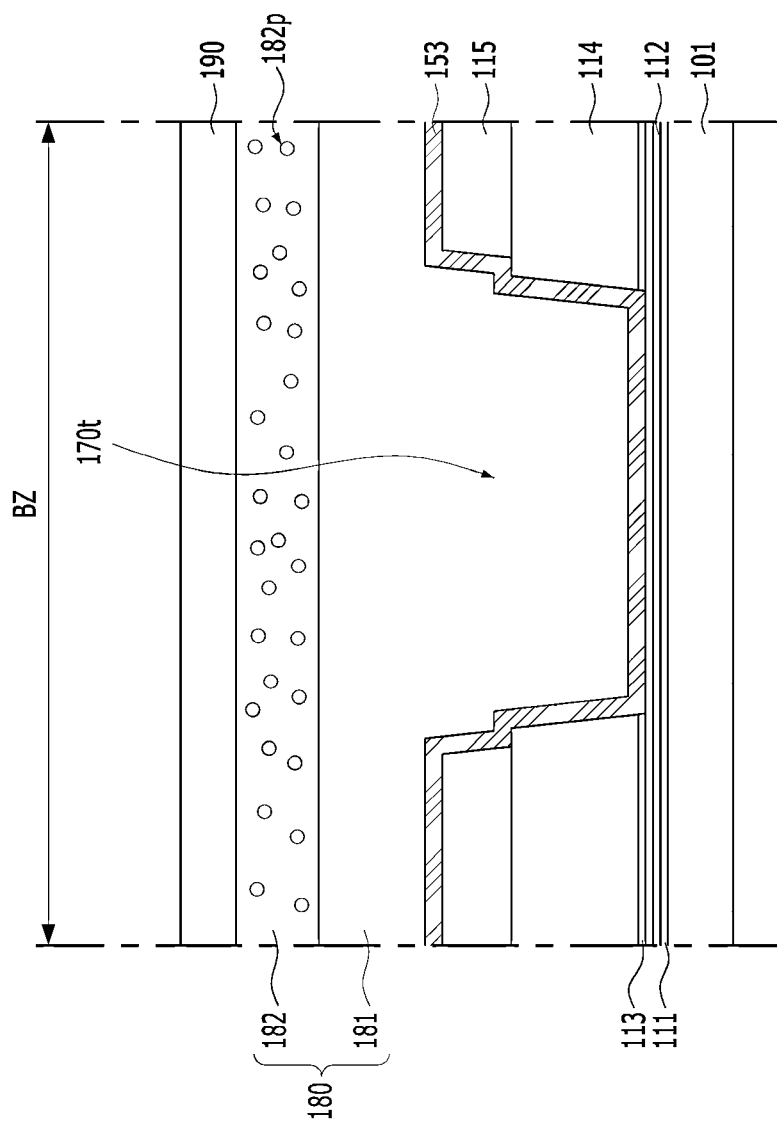

The display apparatus according to another example embodiment of the present disclosure may include the encapsulating element 180 having a multi-layer structure. For example, in the display apparatus according to another example embodiment of the present disclosure, the encapsulating element 180 between the second electrode 153 and the encapsulation substrate 190 may have a stacked structure of a first encapsulating layer 181 and a second encapsulating layer 182, as shown in FIGS. 17 to 19. The second encapsulating layer 182 may be disposed between the first encapsulating layer 181 and the encapsulation substrate 190. For example, the encapsulation substrate 190 may be in direct contact with the second encapsulating layer 182. The moisture absorbing particles 182p may be disposed in the second encapsulating layer 182. Thus, in the display apparatus according to another example embodiment of the present disclosure, the stress applied to the light-emitting devices 150 due to the expansion of the moisture absorbing particles 182p may be relieved by the first encapsulating layer 181.

The moisture blocking holes 170h and the moisture blocking trenches 170t on the bezel area BZ of the device substrate 101 may be filled with the first encapsulating layer 181. Thus, in the display apparatus according to another embodiment of the present disclosure, the external moisture penetrating through the over-coat layer 114 and the bank insulating layer 115 of the bezel area BZ may be collected by the moisture absorbing particles 182p, and the damage of the second electrode 153 due to the expansion of the moisture absorbing particles 182p may be prevented by the first encapsulating layer 181. Therefore, in the display apparatus according to another example embodiment of the present disclosure, the deterioration of each light-emitting layer 152 due to the penetration of the external moisture may be minimized.

Figure 20:
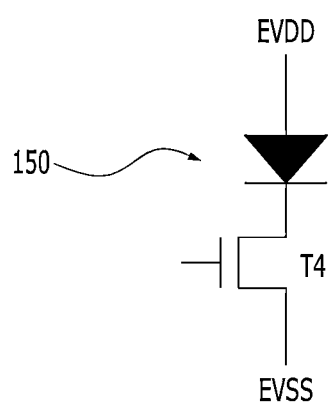
FIG. 20 is a view showing a configuration of a portion of a pixel area in the display apparatus according to another example embodiment of the present disclosure.

Referring back to FIG. 2, the light-emitting device 150 in this example embodiment has an anode connected to the second and third thin film transistors T2 and T3 (e.g., to a source or drain electrode of each of the thin film transistors T2 and T3) and a cathode connected to a node or a line for coupling to a power voltage supply, such as a low power voltage supply (e.g., a ground). The anode and cathode of the light-emitting device 150 of FIG. 2 may correspond to, for example, the first electrode 151 and the second electrode 153, respectively, of the light-emitting device 150 of FIG. 3. However, it should be noted that the subject technology is not limited to the circuit configuration shown in FIG. 2. For example, FIG. 20 illustrates a circuit configuration in a portion of a pixel area according to another example embodiment of the present disclosure. In FIG. 20, a light-emitting device 150 may be placed above a thin film transistor T4, which can drive the light-emitting device 150. In this example, an anode of the light-emitting device 150 may be connected to a node or a line for coupling to a power voltage supply, such as a high power voltage supply EVDD, and a cathode of such light-emitting device 150 may be connected to the thin film transistor T4 (e.g., to a source or drain electrode of the thin film transistor T4). The anode and cathode of the light-emitting device 150 of FIG. 20 may correspond to, for example, the second electrode 153 and the first electrode 151, respectively, of the light-emitting device 150 of FIG. 3. FIG. 20 illustrates only a portion of a pixel area PA, and the pixel area PA may include other components. It should be noted that FIGS. 2 and 20 are example circuit configurations, and the subject technology is not limited to these configurations.

In connection with the descriptions provided herein, the display apparatus according to the embodiments of the present disclosure may comprise a over-coat layer on a display area and a bezel area of a device substrate, a light-emitting device on the over-coat layer of the display area, a bank insulating layer covering an edge of a first electrode of the light-emitting device, and at least one opening (e.g., a moisture blocking hole or a moisture blocking trench) penetrating the over-coat layer and the bank insulating layer of the bezel area, wherein the sidewall of the opening may be covered by a second electrode of the light-emitting device. Thus, in the display apparatus according to the embodiments of the present disclosure, the external moisture penetrating through the over-coat layer and the bank insulating layer may be blocked or delayed. Thereby, in the display apparatus according to the embodiments of the present disclosure, the deterioration of the image quality due to the external moisture may be minimized.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes. In other words, the disclosed embodiments are intended to illustrate the scope of the technical features of the present disclosure. Thus, the scope of the present disclosure is not limited to the embodiments shown, but is to be accorded the widest scope consistent with the claims. The scope of protection of the present disclosure should be construed based on the following claims, and all technical features within the scope of equivalents thereof should be construed as being included within the scope of the present disclosure.

What is claimed is:

1. A display apparatus, comprising:
a display area and a bezel area, wherein the bezel area is disposed outside the display area, and wherein the display area includes a pixel area;
a device substrate provided in the display area and the bezel area;
a light-emitting device disposed in the pixel area of the display area and on the device substrate, the light-emitting device including a first electrode, a light-emitting layer and a second electrode, which are sequentially stacked in an emission area of the pixel area;
an over-coat layer disposed between the device substrate and the light-emitting device, the over-coat layer extending in the bezel area and on the device substrate;
a bank insulating layer covering an edge of the first electrode, the bank insulating layer extending on the over-coat layer of the bezel area; and
a moisture blocking hole disposed in the bezel area and on the device substrate,
wherein:
the emission area of the pixel area is defined by the bank insulating layer;
the pixel area includes a non-emission area overlapping the bank insulating layer outside the emission area;
the moisture blocking hole penetrates the over-coat layer and the bank insulating layer; and
the second electrode of the light-emitting device extends on a sidewall of the moisture blocking hole.

2. The display apparatus according to claim 1, wherein the second electrode of the light-emitting device includes a metal.

3. The display apparatus according to claim 1, wherein the first electrode, rather than the second electrode, is closer to the over-coat layer.

4. The display apparatus according to claim 1, wherein the second electrode of the light-emitting device extends on a bottom surface of the moisture blocking hole.

5. The display apparatus according to claim 1, further comprising:
signal wirings; and
a pixel driving circuit electrically connected to the signal wirings,
wherein:
the signal wirings extend in the bezel area and on the device substrate; and
the moisture blocking hole is disposed between the signal wirings.

6. The display apparatus according to claim 5, wherein the moisture blocking hole extends in a same direction as the signal wirings.

7. The display apparatus according to claim 1, further comprising:
a moisture blocking pattern disposed between the sidewall of the moisture blocking hole and the second electrode of the light-emitting device.

8. The display apparatus according to claim 7, wherein an end of the moisture blocking pattern is disposed between the over-coat layer and the bank insulating layer in the bezel area.

9. The display apparatus according to claim 7, wherein the moisture blocking pattern includes a same material as the first electrode of the light-emitting device.

10. The display apparatus according to claim 7, wherein the moisture blocking pattern is formed simultaneously with the first electrode of the light-emitting device.

11. The display apparatus according to claim 1, further comprising:
an encapsulating element covering the light-emitting device, the encapsulating element extending in the bezel area and on the device substrate,
wherein the moisture blocking hole is filled with the encapsulating element.

12. The display apparatus according to claim 11, wherein the encapsulating element includes moisture absorbing particles.

13. A display apparatus, comprising:
a device substrate;

a display area and a bezel area, the display area including a pixel area;

an over-coat layer disposed in the display area and the bezel area and on the device substrate;

a light-emitting device disposed on the over-coat layer of the display area, the light-emitting device including a first electrode, a light-emitting layer and a second electrode, which are sequentially stacked in an emission area of the pixel area;

a bank insulating layer covering an edge of the first electrode, the bank insulating layer extending on the over-coat layer of the bezel area; and a moisture blocking trench penetrating the over-coat layer and the bank insulating layer in the bezel area, wherein the emission area of the pixel area is defined by the bank insulating layer, wherein the pixel area includes a non-emission area overlapping with the bank insulating layer outside the emission area, wherein the moisture blocking trench extends along an edge of the display area, and wherein an inner sidewall of the moisture blocking trench toward the display area is covered by the second electrode of the light-emitting device.

14. The display apparatus according to claim 13, wherein the second electrode of the light-emitting device extends on an outer sidewall of the moisture blocking trench opposite to the display area.

15. The display apparatus according to claim 13, wherein the moisture blocking trench includes a lower trench penetrating the over-coat layer and an upper trench penetrating the bank insulating layer, wherein the upper trench is disposed in the lower trench, and wherein a sidewall of the lower trench is covered by the bank insulating layer.

16. The display apparatus according to claim 13, further comprising a pixel driving circuit between the device substrate and the over-coat layer in the pixel area of the display area, wherein the pixel driving circuit is disposed outside the emission area and overlaps the bank insulating layer in the pixel area.

17. The display apparatus according to claim 13, further comprising:

signal wirings; and a pixel driving circuit electrically connected to the signal wirings, wherein:

the signal wirings extend in the bezel area and on the device substrate; and the moisture blocking trench is disposed outside the signal wirings.

18. The display apparatus according to claim 13, further comprising:

signal wirings extending in the bezel area and on the device substrate; and a moisture blocking hole disposed between the signal wirings, wherein a sidewall of the moisture blocking hole is covered by the second electrode of the light-emitting device.

19. The display apparatus according to claim 13, further comprising:

a device passivation layer disposed between the device substrate and the over-coat layer, wherein:

the device passivation layer includes a material different from the over-coat layer and the bank insulating layer; and the moisture blocking trench penetrates the device passivation layer.

20. The display apparatus according to claim 13, wherein the inner sidewall of the moisture blocking trench has a stepped shape.

21. The display apparatus according to claim 13, wherein the inner sidewall of the moisture blocking trench has a concave-convex shape, in plan-view.

\* \* \* \* \*